(12) United States Patent
Shimizu

(10) Patent No.: US 12,176,398 B2
(45) Date of Patent: Dec. 24, 2024

(54) SEMICONDUCTOR DEVICE, SEMICONDUCTOR DEVICE MANUFACTURING METHOD, INVERTER CIRCUIT, DRIVE DEVICE, VEHICLE, AND ELEVATOR

(71) Applicant: KABUSHIKI KAISHA TOSHIBA, Tokyo (JP)

(72) Inventor: Tatsuo Shimizu, Shinagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 373 days.

(21) Appl. No.: 17/653,168

(22) Filed: Mar. 2, 2022

(65) Prior Publication Data

US 2023/0082881 A1    Mar. 16, 2023

(30) Foreign Application Priority Data

Sep. 16, 2021   (JP) ................. 2021-150893

(51) Int. Cl.
*H01L 21/02*   (2006.01)
*H01L 29/04*   (2006.01)
*H01L 29/10*   (2006.01)
*H01L 29/16*   (2006.01)

(52) U.S. Cl.
CPC .... *H01L 29/1608* (2013.01); *H01L 21/02529* (2013.01); *H01L 21/0262* (2013.01); *H01L 29/04* (2013.01); *H01L 29/1066* (2013.01)

(58) Field of Classification Search
None
See application file for complete search history.

(56) References Cited

U.S. PATENT DOCUMENTS

| 9,324,826 B2 | 4/2016 | Shimizu et al. |
| 11,824,083 B2 * | 11/2023 | Shimizu ................ H01L 29/518 |
| 2002/0172774 A1 | 11/2002 | Lipkin |
| 2018/0069081 A1 | 3/2018 | Nagasawa et al. |
| 2020/0091297 A1 | 3/2020 | Shimizu |
| 2021/0296128 A1 | 9/2021 | Shimizu et al. |

(Continued)

FOREIGN PATENT DOCUMENTS

| JP | 2005-279833 A | 10/2005 |
| JP | 2008-205296 A | 9/2008 |

(Continued)

*Primary Examiner* — Jack S Chen
(74) *Attorney, Agent, or Firm* — Oblon, McClelland, Maier & Neustadt, L.L.P.

(57) ABSTRACT

A semiconductor device of embodiments includes: a silicon carbide layer having a first face having an off angle equal to or more than 0° and equal to or less than 8° with respect to a {0001} face and a second face facing the first face and having a 4H-SiC crystal structure; a gate electrode extending in a first direction parallel to the first face; a silicon oxide layer between the silicon carbide layer and the gate electrode; and a region disposed between the silicon carbide layer and the silicon oxide layer and having a nitrogen concentration equal to or more than $1 \times 10^{21}$ cm$^{-3}$. Assuming that a first reference length in the first direction is 0.5 μm, a surface roughness of a surface of the silicon carbide layer in a range of the first reference length is equal to or less than 1 nm.

9 Claims, 32 Drawing Sheets

(56) References Cited

U.S. PATENT DOCUMENTS

| 2022/0005925 A1 | 1/2022 | Shimizu et al. |
| 2022/0302250 A1 | 9/2022 | Shimizu |
| 2022/0302261 A1 | 9/2022 | Shimizu |

FOREIGN PATENT DOCUMENTS

| JP | 2011-254119 A | 12/2011 |
| JP | 2015-146450 A | 8/2015 |
| JP | 2018-035051 A | 3/2018 |
| JP | 2020-47668 A | 3/2020 |
| JP | 2021-022706 A | 2/2021 |
| JP | 2021-153168 A | 9/2021 |
| JP | 2022-012282 A | 1/2022 |
| JP | 2022-144216 A | 10/2022 |
| JP | 2022-144217 A | 10/2022 |

\* cited by examiner

AA' CROSS SECTION

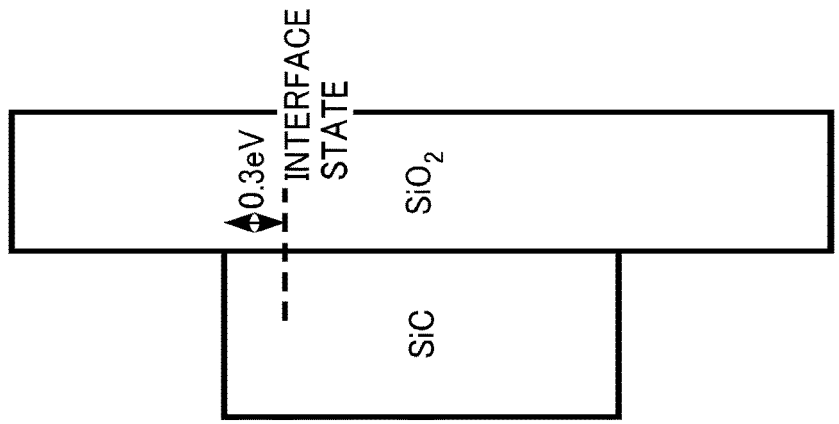
FIG.25C THIRD SURFACE STRUCTURE
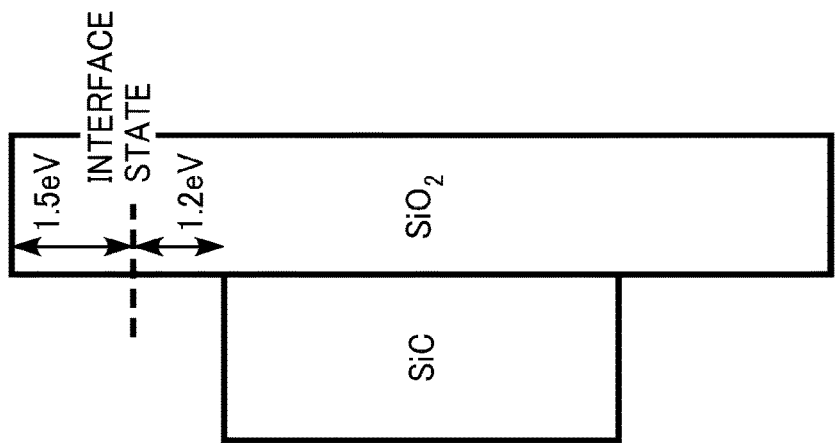
FIG.25B SECOND SURFACE STRUCTURE
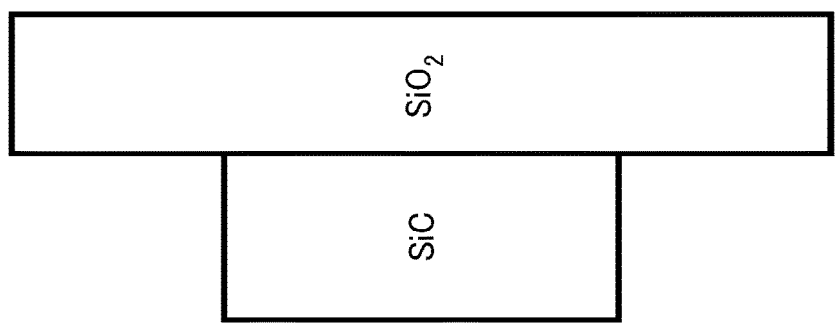
FIG.25A FIRST SURFACE STRUCTURE

SEMICONDUCTOR DEVICE, SEMICONDUCTOR DEVICE MANUFACTURING METHOD, INVERTER CIRCUIT, DRIVE DEVICE, VEHICLE, AND ELEVATOR

CROSS-REFERENCE TO RELATED APPLICATION

This application is based upon and claims the benefit of priority from Japanese Patent Application No. 2021-150893, filed on Sep. 16, 2021, the entire contents of which are incorporated herein by reference.

FIELD

Embodiments described herein relate generally to a semiconductor device, a semiconductor device manufacturing method, an inverter circuit, a drive device, a vehicle, and an elevator.

BACKGROUND

Silicon carbide (SiC) is expected as a material for next-generation semiconductor devices. Silicon carbide has excellent physical properties, such as a bandgap of about 3 times, a breakdown field strength of about 10 times, and a thermal conductivity of about 3 times that of silicon (Si). By using such characteristics, it is possible to realize a semiconductor device that can operate at high temperature with low loss.

For example, when forming a metal oxide semiconductor field effect transistor (MOSFET) using silicon carbide, there is a risk that the mobility of carriers will decrease. The decrease in the mobility of carriers is caused by, for example, unevenness of the surface of the silicon carbide layer or the interface state between the silicon carbide layer and the gate insulating layer.

BRIEF DESCRIPTION OF THE DRAWINGS

FIGS. 25A, 25B, and 25C are explanatory diagrams of the function and effect of the semiconductor device of the first embodiment.

DETAILED DESCRIPTION

Figure 1:
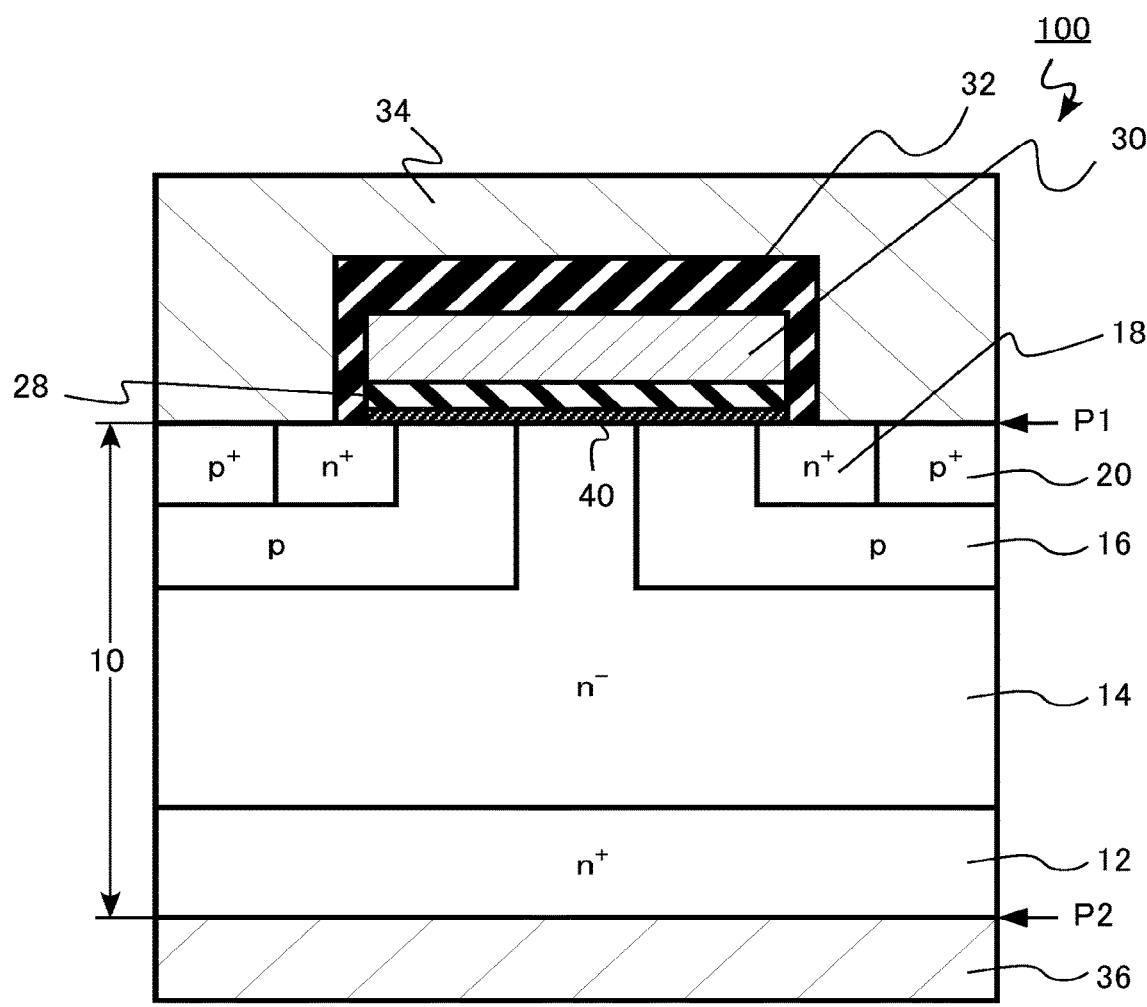
FIG. 1 is a schematic cross-sectional view of a semiconductor device of a first embodiment.

A semiconductor device of embodiments includes: a silicon carbide layer having a 4H-SiC crystal structure, the silicon carbide layer having a first face having an off angle equal to or more than 0° and equal to or less than 8° with respect to a {0001} face and a second face facing the first face; a gate electrode extending in a first direction parallel to the first face; a silicon oxide layer disposed between the first face of the silicon carbide layer and the gate electrode; and a region disposed between the silicon carbide layer and the silicon oxide layer and having a nitrogen concentration equal to or more than $1 \times 10^{21}$ cm$^{-3}$. Assuming that a first reference length in the first direction is 0.5 µm, a surface roughness of a part of the first face of the silicon carbide layer in a range of the first reference length is equal to or less than 1 nm, and the part of the first face faces the gate electrode.

Hereinafter, embodiments will be described with reference to the diagrams. In the following description, the same or similar members and the like will be denoted by the same reference numerals, and the description of the members and the like once described will be omitted as appropriate.

In addition, in the following description, when there are notations of n+, n, n−, p+, p, and p−, these indicate the relative high and low of the impurity concentration in each conductive type. That is, n+ indicates that the n-type impurity concentration is relatively higher than n, and n-indicates that the n-type impurity concentration is relatively lower than n. In addition, p+ indicates that the p-type impurity concentration is relatively higher than p, and p-indicates that the p-type impurity concentration is relatively lower than p. In addition, n+-type and n−-type may be simply described as n-type, p+-type and p−-type may be simply described as p-type. Unless otherwise specified, the impurity concentration in each region is represented by, for example, the value of the impurity concentration in the central portion of each region.

The impurity concentration can be measured by, for example, secondary ion mass spectrometry (SIMS). In addition, the relative high and low of the impurity concentration can be determined from, for example, the high and low of the carrier concentration obtained by scanning capacitance microscopy (SCM). In addition, the distance such as the width or depth of an impurity region can be calculated by, for example, SIMS. In addition, the distance such as the width or depth of an impurity region can be calculated from, for example, an SCM image.

The depth of a trench, the thickness of an insulating layer, and the like can be measured, for example, on the profile of SIMS or the image of a transmission electron microscope (TEM) or by a scanning electron microscope (SEM).

In addition, the bonding states of silicon atoms, carbon atoms, nitrogen atoms, and oxygen atoms in the silicon carbide layer can be identified by using, for example, X-ray photoelectron spectroscopy (XPS method). In addition, the concentrations of various bonding states and the magnitude relationship between the concentrations can be determined by using, for example, X-ray photoelectron spectroscopy (XPS method).

The surface structure of the silicon carbide layer can be observed by using, for example, a TEM image. For example, the arrangement of atoms on the surface of the silicon carbide layer can be analyzed by using a TEM image. In addition, the surface structure of the silicon carbide layer can be analyzed by, for example, scanning tunneling spectroscopy (STS method).

The surface roughness (Rz) of the surface of the silicon carbide layer can be measured by, for example, an atomic force microscope (AFM).

First Embodiment

A semiconductor device of a first embodiment includes: a silicon carbide layer having a first face having an off angle equal to or more than 0° and equal to or less than 8° with respect to a {0001} face and a second face facing the first face and having a 4H-SiC crystal structure; a gate electrode extending in a first direction parallel to the first face; a silicon oxide layer between the silicon carbide layer and the gate electrode; and a region disposed between the silicon carbide layer and the silicon oxide layer and having a nitrogen concentration equal to or more than $1 \times 10^{21}$ cm$^{-3}$. Assuming that a first reference length in the first direction is 0.5 μm, a surface roughness of a part of the first face of the silicon carbide layer in a range of the first reference length is equal to or less than 1 nm, and the part of the first face faces the gate electrode.

FIG. 1 is a schematic cross-sectional view of the semiconductor device of the first embodiment. The semiconductor device is a MOSFET 100. The MOSFET 100 is a double implantation MOSFET (DIMOSFET) in which a p-well and a source region are formed by ion implantation. In addition, the MOSFET 100 is an n-channel MOSFET having electrons as carriers. FIG. 1 is a cross-sectional view taken along the line AA' of FIG. 3.

The MOSFET 100 includes a silicon carbide layer 10, a gate insulating layer 28 (silicon oxide layer), a gate electrode 30, an interlayer insulating film 32, a source electrode 34, a drain electrode 36, and an interface termination region 40 (region).

The silicon carbide layer 10 includes an n+-type drain region 12, an n−-type drift region 14, a p-type p-well region 16 (silicon carbide region), an n+-type source region 18, and a p+-type p-well contact region 20.

The silicon carbide layer 10 is a single crystal SiC semiconductor. The silicon carbide layer 10 has a first face P1 and a second face P2 opposite to the first face P1. Hereinafter, the first face P1 may be referred to as a surface of the silicon carbide layer 10, and the second face P2 may be referred to as a back surface of the silicon carbide layer 10.

Hereinafter, the "depth" means a depth with respect to the first face P1.

The silicon carbide layer 10 is disposed between the source electrode 34 and the drain electrode 36. The source electrode 34 is provided on the first face P1 side of the silicon carbide layer 10. The drain electrode 36 is provided on the second face P2 side of the silicon carbide layer 10.

Figure 2:
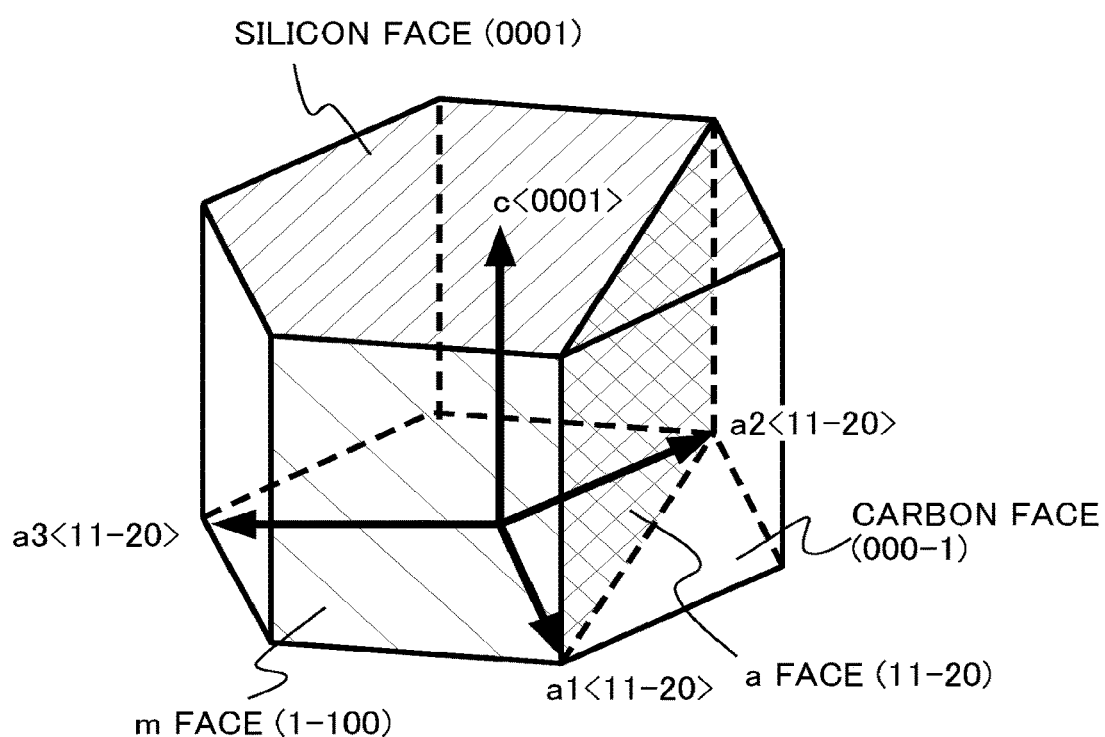
FIG. 2 is a diagram showing a crystal structure of an SiC semiconductor.

FIG. 2 is a diagram showing the crystal structure of an SiC semiconductor. A typical crystal structure of the SiC semiconductor is a hexagonal system such as 4H-SiC. One of the faces (top surface of the hexagonal column) whose normal line is a c axis along the axial direction of the hexagonal column is a (0001) face. The face equivalent to the (0001) face is referred to as a silicon face (Si face) and denoted as a {0001} face. Silicon atoms (Si) are arranged on the outermost surface of the silicon face.

The other side of the face (top face of the hexagonal column) whose normal line is the c axis along the axial direction of the hexagonal column is a (000-1) face. The face equivalent to the (000-1) face is referred to as a carbon face (C face) and denoted as a {000-1} face. Carbon atoms (C) are arranged on the outermost surface of the carbon surface.

On the other hand, the side surface (pillar surface) of the hexagonal column is an m face that is a face equivalent to the (1-100) face, that is, a {1-100} face. In addition, the face passing through a pair of ridge lines not adjacent to each other is an a face that is a face equivalent to the (11-20) face, that is, a {11-20} face. Both silicon atoms (Si) and carbon atoms (C) are arranged on the outermost surfaces of the m face and the a face.

The c axis extends in the <0001> direction. The a1 axis, the a2 axis, and the a3 axis extend in the <11-20> direction.

The silicon carbide layer 10 has a 4H-SiC crystal structure. The first face P1 of the silicon carbide layer 10 has an off-angle equal to or more than 0° and equal to or less than 8° with respect to the {0001} face. The first face P1 is a face inclined by an angle equal to or more than 0° and equal to or less than 8° with respect to the silicon face, and the second face P2 is a face inclined by an angle equal to or more than 0° and equal to or less than 8° with respect to the carbon face.

Figure 3:
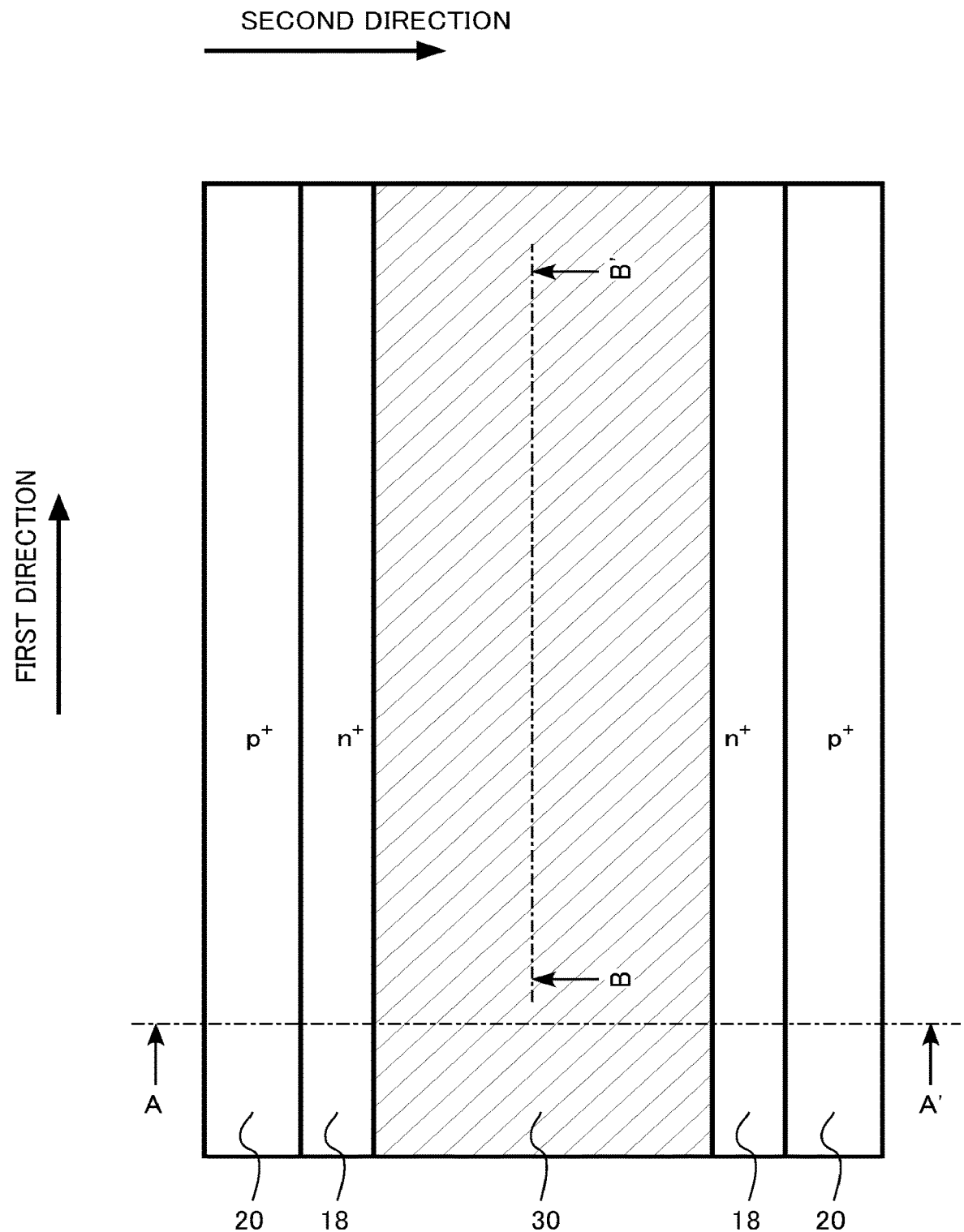
FIG. 3 is a schematic top view of the semiconductor device of the first embodiment.

FIG. 3 is a schematic top view of the semiconductor device of the first embodiment. FIG. 3 shows the patterns of the source region 18, the p-well contact region 20, and the gate electrode 30 on the first face P1 side of the MOSFET 100. As shown in FIG. 3, the gate electrode 30 extends in the first direction.

In addition, the first direction is parallel to the first face P1. The second direction is parallel to the first face P1. The second direction is perpendicular to the first direction.

In the MOSFET 100, the first direction is a channel width direction and the second direction is a channel length direction.

Figure 4:
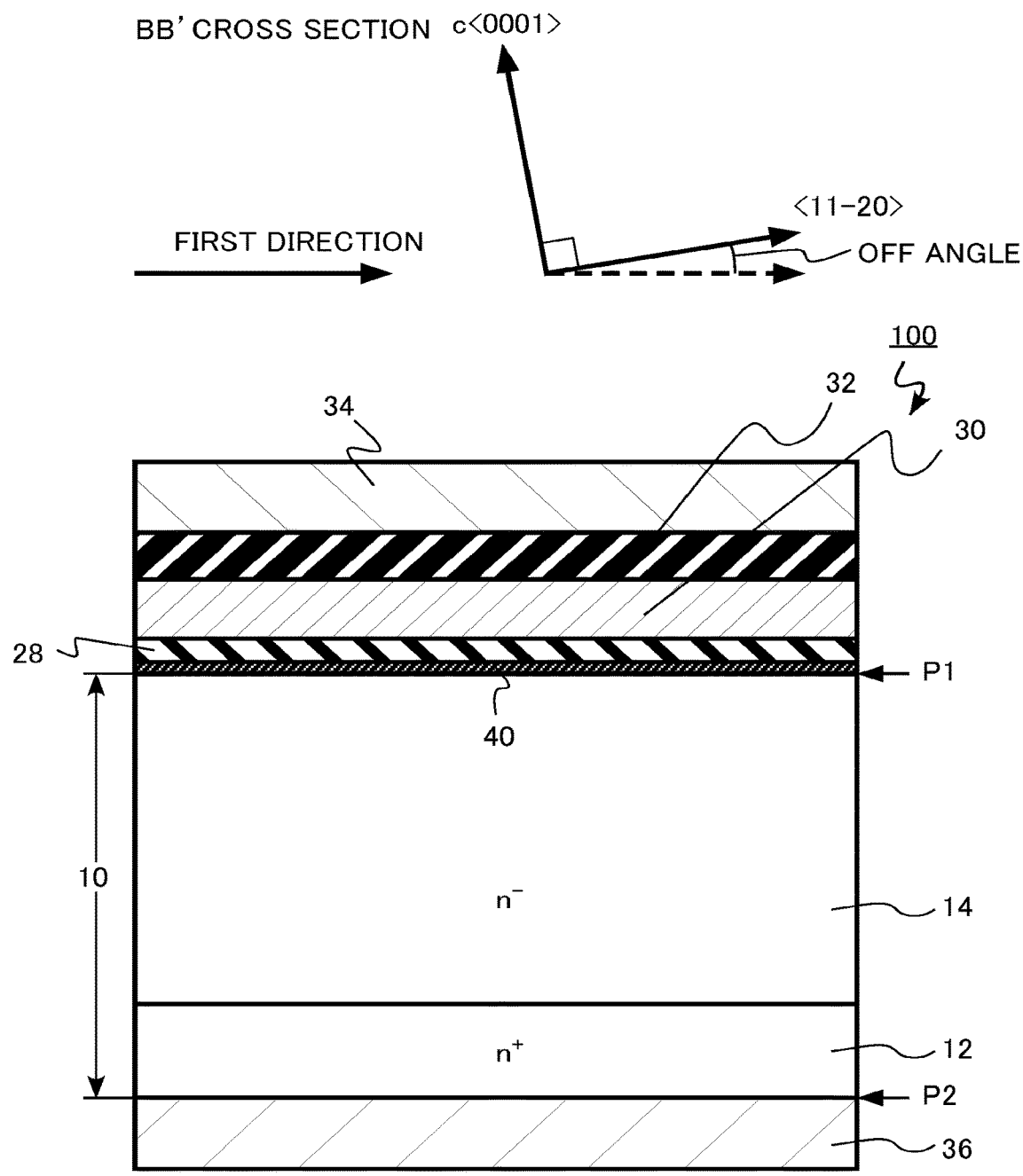
FIG. 4 is a schematic cross-sectional view of the semiconductor device of the first embodiment.

FIG. 4 is a schematic cross-sectional view of the semiconductor device of the first embodiment. FIG. 4 is a cross-sectional view taken along the line BB' of FIG. 3.

As shown in FIG. 4, the c axis of the silicon carbide layer 10 is inclined in the <11-20> direction. In other words, the first face P1 of the silicon carbide layer 10 is inclined in the <11-20> direction with respect to the {0001} face. The off angle shown in FIG. 4 is equal to or more than 0° and equal to or less than 8°.

The angle between the first direction and the <11-20> direction is, for example, equal to or less than 10°. The angle between a component of the <11-20> direction parallel to the first face P1 and the first direction is, for example, equal to or less than 10°. The component of the <11-20> direction parallel to the first face P1 and the first direction match each other, for example.

Figure 5:
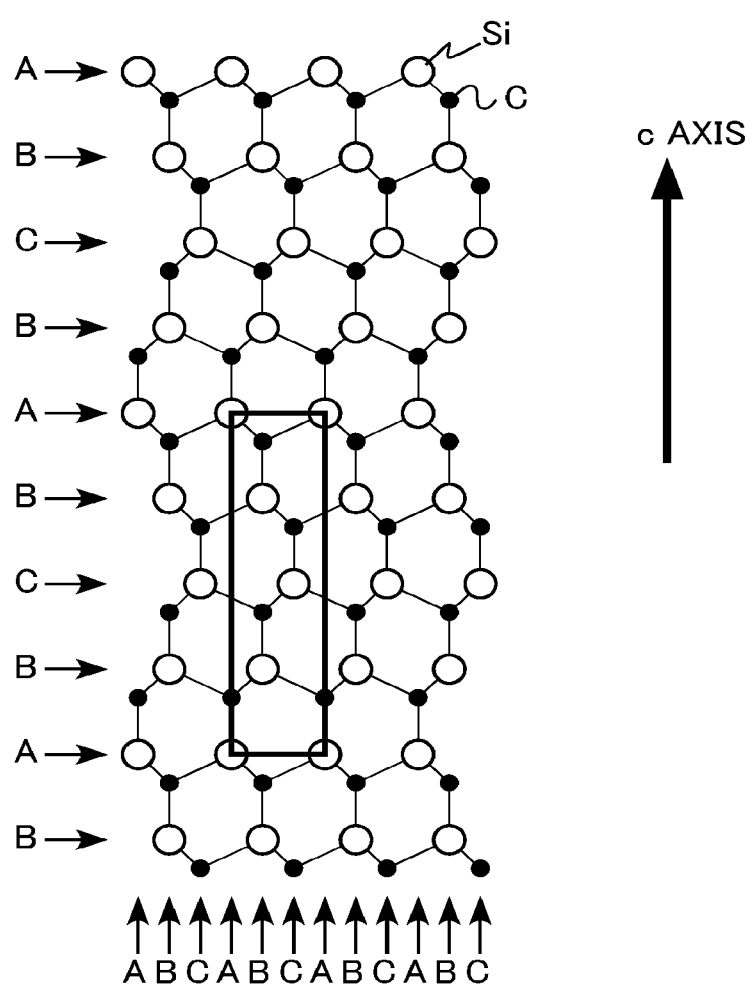
FIG. 5 is a diagram showing a crystal structure of a 4H-SiC semiconductor.

FIG. 5 is a diagram showing a crystal structure of a 4H-SiC semiconductor. FIG. 5 shows the arrangement of silicon atoms and carbon atoms of a 4H-SiC semiconductor.

In FIG. 5, silicon atoms are expressed by white circles and carbon atoms are expressed by black circles. The region surrounded by a square is a 4H-SiC unit cell. The 4H-SiC is configured by repeatedly arranging the unit cells in the translation direction.

The 4H-SiC contains four silicon atomic layers in one cycle in the stacking direction (c-axis direction). As the site position of the silicon atom, there are three site positions of A site, B site, and C site.

Figure 6:
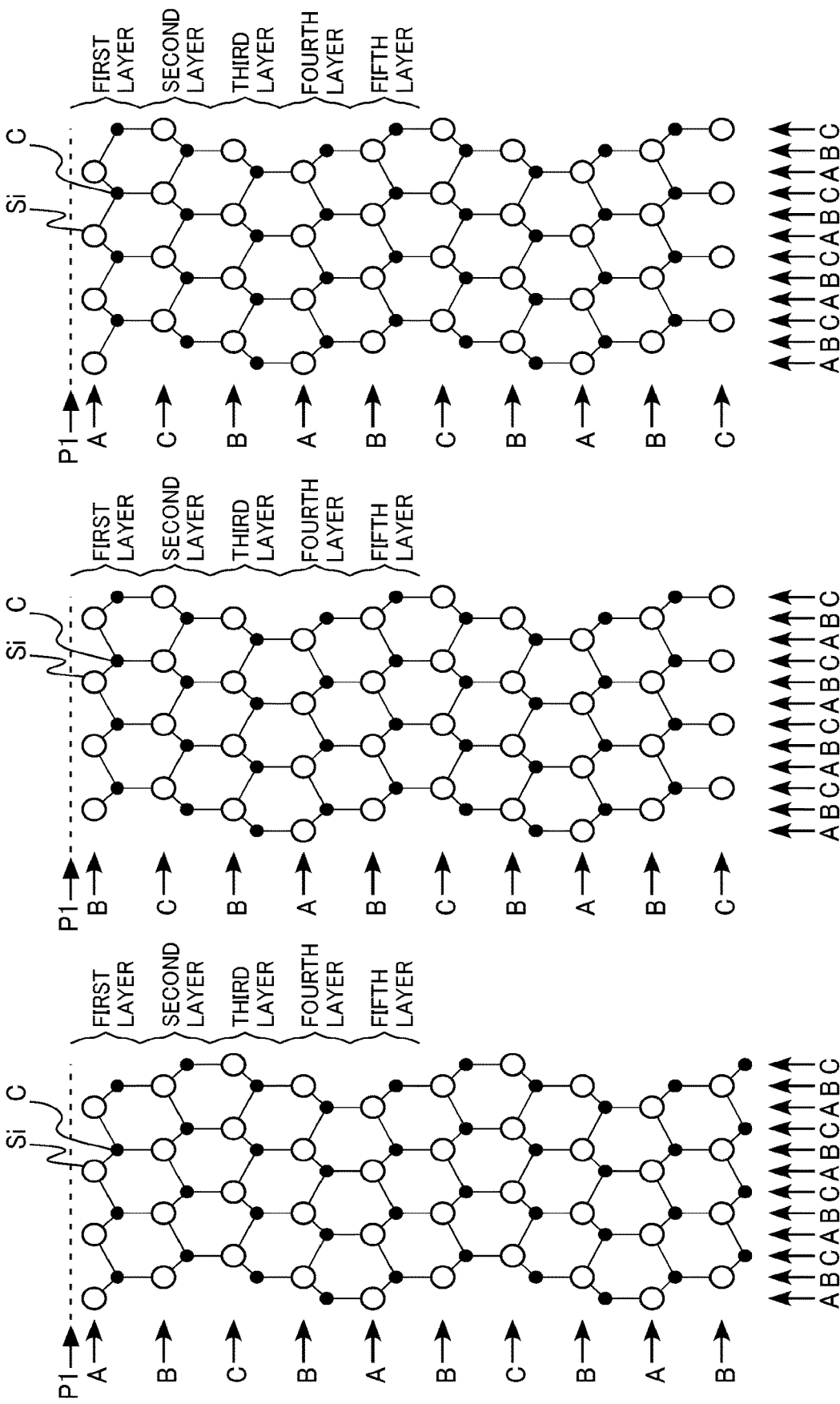
FIGS. 6A, 6B, and 6C are diagrams showing the surface structure of a 4H-SiC semiconductor.

FIGS. 6A, 6B, and 6C are diagrams showing the surface structure of a 4H-SiC semiconductor. FIGS. 6A, 6B, and 6C are explanatory diagrams of a surface structure that can be formed on the surface of the 4H-SiC semiconductor. FIGS. 6A, 6B, and 6C are explanatory diagrams of the surface structure that can be formed on the first face P1 of the silicon carbide layer 10. FIG. 6A shows a first surface structure, FIG. 6B shows a second surface structure, and FIG. 6C shows a third surface structure. Each of the first to fifth layers shown in FIGS. 6A, 6B, and 6C includes an upper silicon atomic layer and a lower carbon atomic layer.

The silicon atom disposed in the first layer of the outermost surface of the first surface structure shown in FIG. 6A is the first silicon atom. The site position of the first silicon atom is different from the site position of the silicon atom in the third layer from the first face P1, and is the same as the site position of the silicon atom in the fifth layer from the first face P1.

In the first surface structure, the site position of the first silicon atom disposed in the first layer of the outermost surface is the A site. The site position of the silicon atom in the third layer from the first face P1 is the C site. The site position of the silicon atom in the fifth layer from the first face P1 is the A site. Therefore, the site position of the first silicon atom is different from the site position of the silicon atom in the third layer from the first face P1, and is the same as the site position of the silicon atom in the fifth layer from the first face P1.

The silicon atom disposed in the first layer of the outermost surface of the second surface structure shown in FIG. 6B is the second silicon atom. The site position of the second silicon atom is the same as the site position of the silicon atom in the third layer from the first face P1, and is the same as the site position of the silicon atom in the fifth layer from the first face P1.

In the second surface structure, the site position of the second silicon atom disposed in the first layer of the outermost surface is the B site. The site position of the silicon atom in the third layer from the first face P1 is the B site. The site position of the silicon atom in the fifth layer from the first face P1 is the B site. Therefore, the site position of the second silicon atom is the same as the site position of the silicon atom in the third layer from the first face P1, and is the same as the site position of the silicon atom in the fifth layer from the first face P1.

The silicon atom disposed in the first layer of the outermost surface of the third surface structure shown in FIG. 6C is the third silicon atom. The site position of the third silicon atom is different from the site position of the silicon atom in the third layer from the first face P1, and is also different from the site position of the silicon atom in the fifth layer from the first face P1.

In the third surface structure, the site position of the third silicon atom disposed in the first layer of the outermost surface is the A site. The site position of the silicon atom in the third layer from the first face P1 is the B site. The site position of the silicon atom in the fifth layer from the first face P1 is the B site. Therefore, the site position of the third silicon atom is different from the site position of the silicon atom in the third layer from the first face P1, and is also different from the site position of the silicon atom in the fifth layer from the first face P1. In the third surface structure, the periodicity of the first layer on the outermost surface is broken.

The drain region 12 is an $n^+$-type SiC. The drain region 12 contains, for example, nitrogen (N) as an n-type impurity. The n-type impurity concentration in the drain region 12 is, for example, equal to or more than $1 \times 10^{18}$ cm$^{-3}$ and equal to or less than $1 \times 10^{21}$ cm$^{-3}$.

The drift region 14 is provided on the drain region 12. The drift region 14 is an $n^-$-type SiC. The drift region 14 contains, for example, nitrogen as an n-type impurity.

The n-type impurity concentration in the drift region 14 is lower than the n-type impurity concentration in the drain region 12. The n-type impurity concentration in the drift region 14 is, for example, equal to or more than $1 \times 10^{15}$ cm$^{-3}$ and equal to or less than $2 \times 10^{16}$ cm$^{-3}$. The drift region 14 is, for example, an SiC epitaxial growth layer formed on the drain region 12 by an epitaxial growth method.

The thickness of the drift region 14 is, for example, equal to or more than 5 µm and equal to or less than 100 µm.

The p-well region 16 is provided on a partial surface of the drift region 14. The p-well region 16 is disposed between the drift region 14 and the gate insulating layer 28. The p-well region 16 is in contact with the first face P1. The p-well region 16 is a p-type SiC.

The p-well region 16 contains, for example, aluminum (Al) as a p-type impurity. The p-type impurity concentration in the p-well region 16 is, for example, equal to or more than $1 \times 10^{16}$ cm$^{-3}$ and equal to or less than $1 \times 10^{20}$ cm$^{-3}$.

The depth of the p-well region 16 is, for example, equal to or more than 0.4 µm and equal to or less than 0.8 µm. The p-well region 16 functions as a channel region of the MOSFET 100.

The source region 18 is provided on a partial surface of the p-well region 16. The source region 18 is an $n^+$-type SiC. The source region 18 contains, for example, phosphorus (P)

as an n-type impurity. The n-type impurity concentration in the source region 18 is, for example, equal to or more than $1\times10^{18}$ cm$^{-3}$ and equal to or less than $1\times10^{22}$ cm$^{-3}$.

The depth of the source region 18 is smaller than the depth of the p-well region 16. The depth of the source region 18 is, for example, equal to or more than 0.2 μm and equal to or less than 0.4 μm.

The p-well contact region 20 is provided on a partial surface of the p-well region 16. The p-well contact region 20 is provided on the side of the source region 18. The p-well contact region 20 is a p$^+$-type SiC.

The p-well contact region 20 contains, for example, aluminum as a p-type impurity. The p-type impurity concentration in the p-well contact region 20 is, for example, equal to or more than $1\times10^{18}$ cm$^{-3}$ and equal to or less than $1\times10^{22}$ cm$^{-3}$.

The depth of the p-well contact region 20 is smaller than the depth of the p-well region 16. The depth of the p-well contact region 20 is, for example, equal to or more than 0.2 μm and equal to or less than 0.4 μm.

The gate insulating layer 28 is provided between the silicon carbide layer 10 and the gate electrode 30. The gate insulating layer 28 is provided between the drift region 14 and the gate electrode 30 and between the p-well region 16 and the gate electrode 30. The gate insulating layer 28 is provided above the drift region 14 and the p-well region 16. The gate insulating layer 28 is continuously formed on the surfaces of the drift region 14 and the p-well region 16.

The gate insulating layer 28 contains silicon oxide. The gate insulating layer 28 is an example of the silicon oxide layer.

The thickness of the gate insulating layer 28 is, for example, equal to or more than 30 nm and equal to or less than 100 nm. The gate insulating layer 28 functions as a gate insulating layer of the MOSFET 100.

The interface termination region 40 is disposed between the silicon carbide layer 10 and the gate insulating layer 28. The interface termination region 40 is disposed between the drift region 14 and the gate insulating layer 28 and between the p-well region 16 and the gate insulating layer 28. The interface termination region 40 contains nitrogen (N) as a termination element for terminating the dangling bond of the silicon carbide layer 10. The interface termination region 40 is an example of the region.

The concentration of nitrogen in the interface termination region 40 is equal to or more than $1\times10^{21}$ cm$^{-3}$. The concentration of nitrogen in the interface termination region 40 is, for example, equal to or more than $1\times10^{22}$ cm$^{-3}$.

Figure 7:
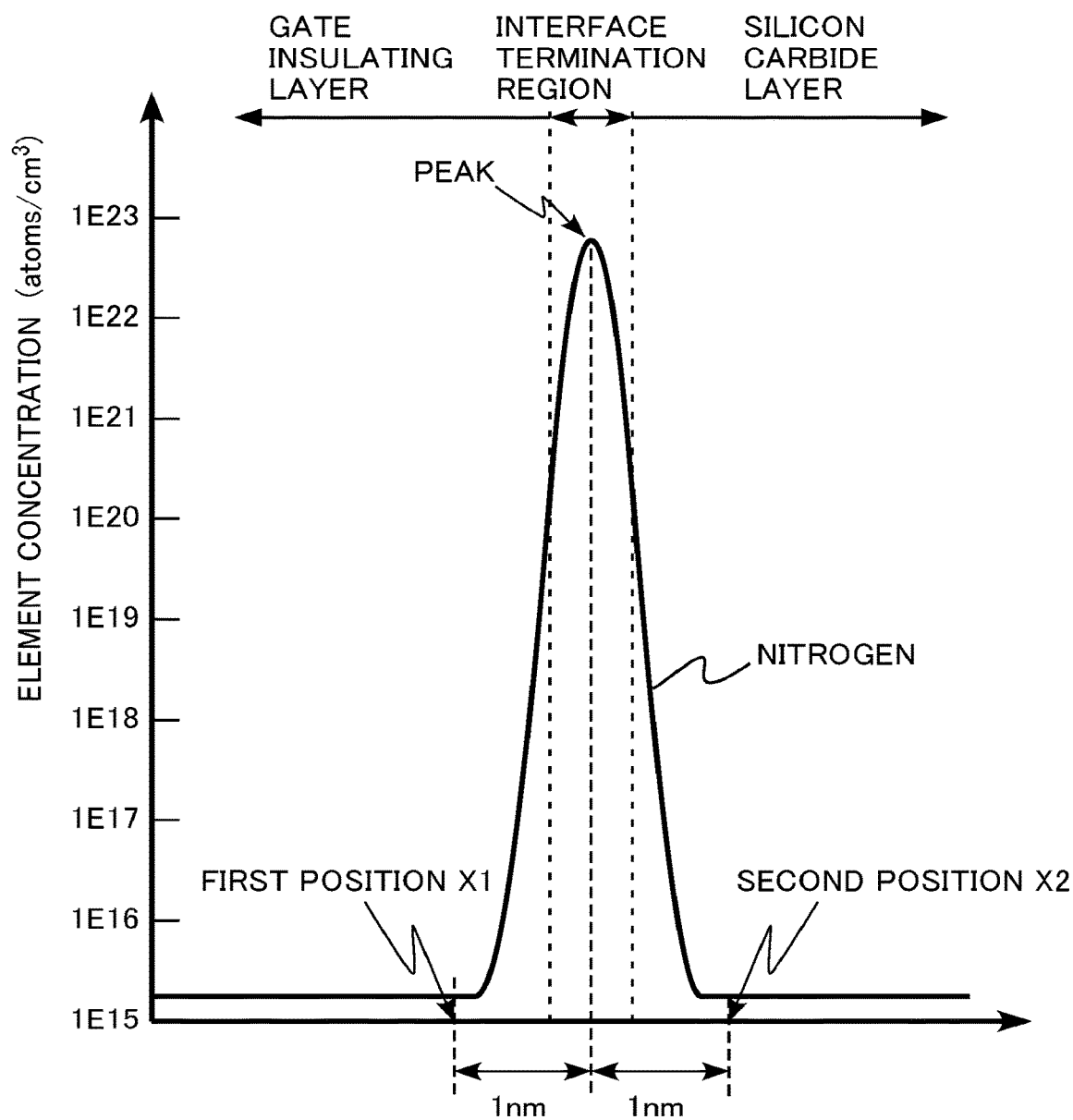
FIG. 7 is a diagram showing the element concentration distribution of the semiconductor device of the first embodiment.

FIG. 7 is a diagram showing the element concentration distribution of the semiconductor device of the first embodiment. FIG. 7 is a diagram showing the element concentration distribution in the gate insulating layer 28, the interface termination region 40, and the silicon carbide layer 10. FIG. 7 shows the concentration distribution of nitrogen.

The nitrogen concentration distribution has a peak in the interface termination region 40. The peak nitrogen concentration is, for example, equal to or more than $1\times10^{21}$ cm$^{-3}$ and equal to or less than $4\times10^{23}$ cm$^{-3}$. The nitrogen concentration at the peak of the nitrogen concentration distribution is, for example, equal to or more than $1\times10^{21}$ cm$^{-3}$.

The full width at half maximum with respect to the peak of the nitrogen concentration distribution is, for example, equal to or less than 1 nm. Nitrogen is segregated at the interface between the silicon carbide layer 10 and the gate insulating layer 28.

The nitrogen concentration at a first position (X1 in FIG. 7) 1 nm away from the peak of the nitrogen concentration distribution toward the gate insulating layer 28 is equal to or less than $1\times10^{18}$ cm$^{-3}$. The nitrogen concentration at a second position (X2 in FIG. 7) 1 nm away from the peak of the nitrogen concentration distribution toward the silicon carbide layer 10 is equal to or less than $1\times10^{18}$ cm$^{-3}$.

Figure 8A:
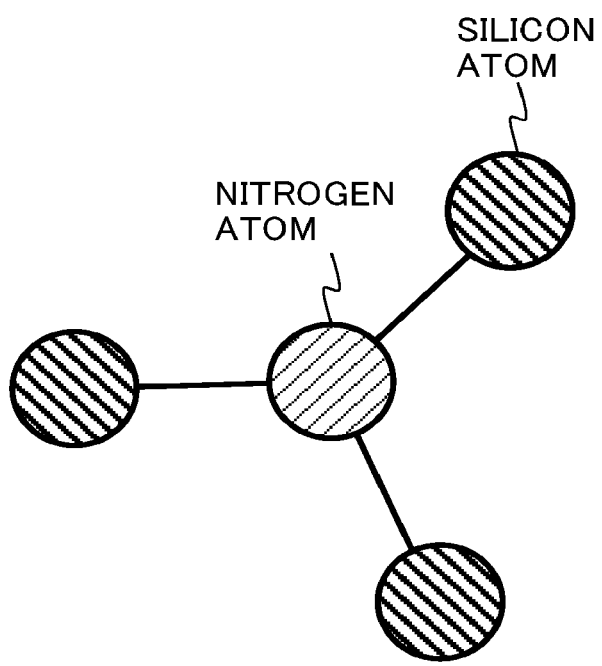
FIGS. 8A and 8B are schematic diagrams showing the bonding state of a nitrogen atom in the semiconductor device of the first embodiment.
Figure 8B:
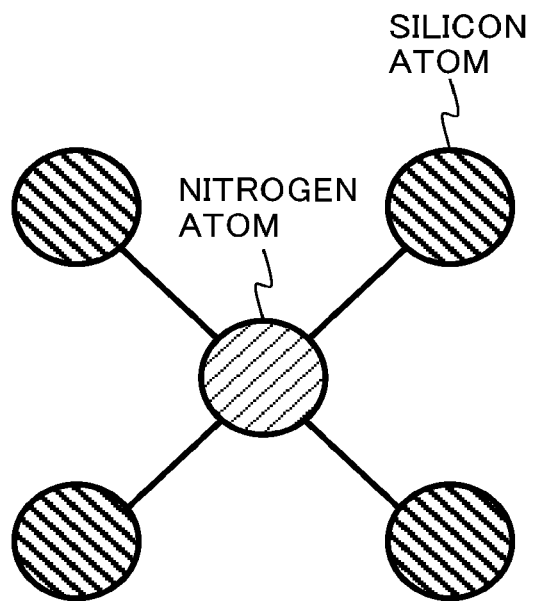

FIGS. 8A and 8B are schematic diagrams showing the bonding state of nitrogen atoms in the semiconductor device in the first embodiment. FIG. 8A shows a case of tri-coordinated nitrogen atom, and FIG. 8B shows a case of four-coordinated nitrogen atom.

In the case of the tri-coordinated nitrogen atom shown in FIG. 8A, the nitrogen atom is bonded to three silicon atoms. In the case of the four-coordinated nitrogen atom shown in FIG. 8B, the nitrogen atom is bonded to four silicon atoms.

In the interface termination region 40, the concentration of nitrogen atoms bonded to three silicon atoms is higher than the concentration of nitrogen atoms bonded to four silicon atoms. In other words, in the interface termination region 40, the concentration of tri-coordinated nitrogen atoms is higher than the concentration of four-coordinated nitrogen atoms.

For example, 90% or more of the nitrogen atoms present in the interface termination region 40 are tri-coordinated nitrogen atoms. The concentration of tri-coordinated nitrogen atoms is, for example, equal to or more than $1\times10^{21}$ cm$^{-3}$.

The tri-coordinated nitrogen atoms present in the interface termination region 40 terminate the dangling bonds on the surface of the silicon carbide layer 10.

The nitrogen atom in the interface termination region 40 substitutes the carbon atom in the uppermost layer of the silicon carbide layer 10. The nitrogen atom in the interface termination region 40 is bonded to the silicon carbide layer 10 in a tri-coordinate bond. The nitrogen atom is present at the position of the carbon atom in the crystal structure of silicon carbide. The silicon atom of the silicon carbide layer 10 is tri-coordinated to the nitrogen atom.

The nitrogen atom in the interface termination region 40 substitutes the carbon atom of the bilayer forming the uppermost layer of the silicon carbide layer 10. The nitrogen atom is finally bonded to the silicon carbide layer 10 in a tri-coordinate bond. Excess silicon atoms or carbon atoms are released from the silicon carbide layer 10 to the gate insulating layer 28 side. The nitrogen atom is present at the position of the carbon atom in the crystal structure of silicon carbide. Some of the silicon atoms on the outermost surface enter the gate insulating layer 28, and the nitrogen atom is bonded to the silicon atoms of the silicon carbide layer 10 in a tri-coordinate bond.

The nitrogen atom present in the bulk of the silicon carbide layer 10 and substituting the carbon site of the crystal structure of silicon carbide is a four-coordinated nitrogen atom. Since the four-coordinated nitrogen atom functions as an n-type dopant, the threshold voltage of the MOSFET is reduced.

The concentration of nitrogen atoms bonded to four silicon atoms at the second position X2 is equal to or less than $1\times10^{18}$ cm$^{-3}$. In other words, the concentration of four-coordinated nitrogen atoms at the second position X2 is equal to or less than $1\times10^{18}$ cm$^{-3}$.

Figure 9:
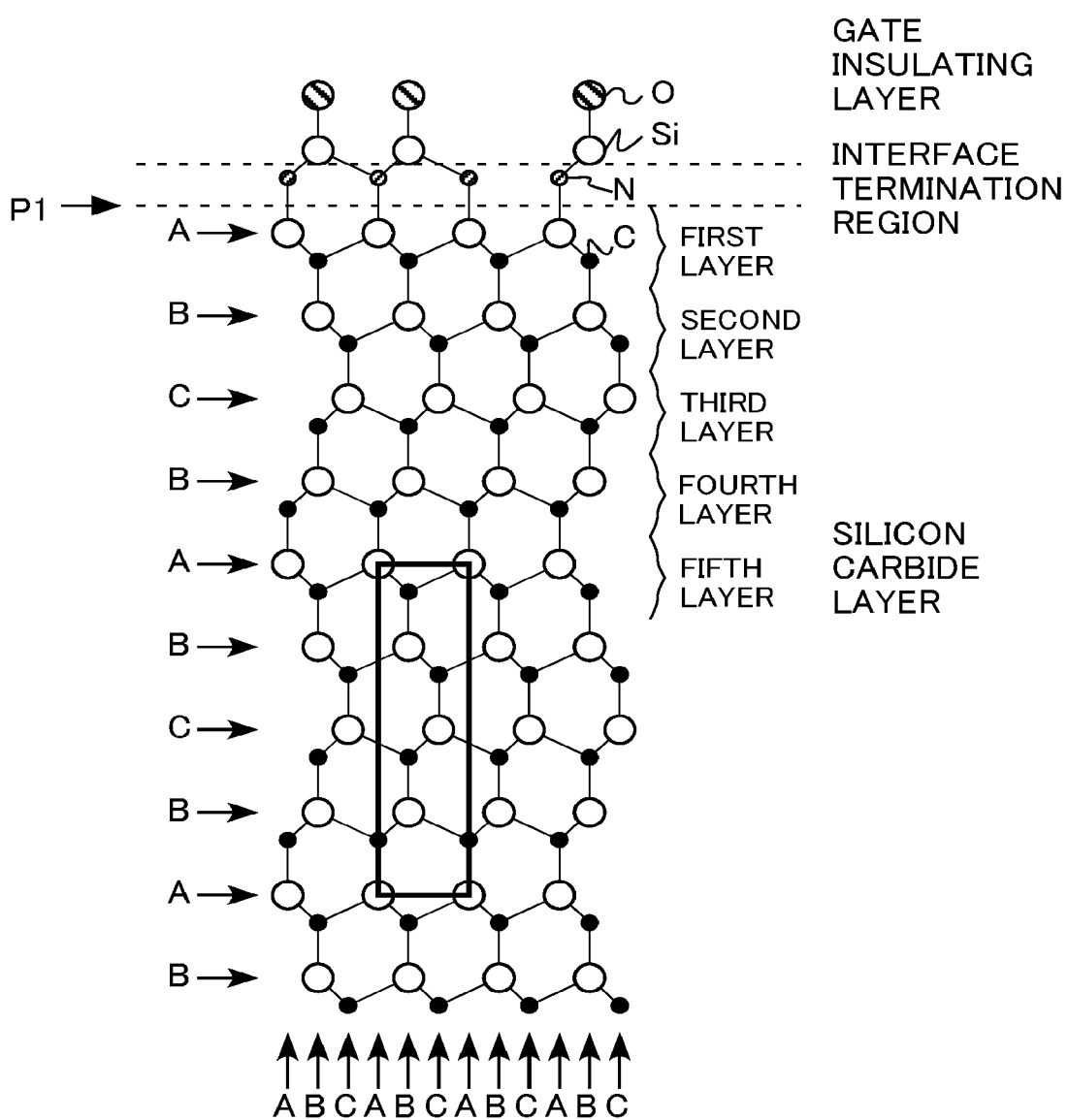
FIG. 9 is an explanatory diagram of the surface structure of a silicon carbide layer of the semiconductor device of the first embodiment.

FIG. 9 is an explanatory diagram of the surface structure of the silicon carbide layer of the semiconductor device of the first embodiment. FIG. 9 shows the arrangement of atoms in the silicon carbide layer 10, the interface termination region 40, and the gate insulating layer 28.

The first face P1 of the silicon carbide layer 10 has a first surface structure. A first silicon atom is present in the first layer, which is the uppermost layer of the first face P1.

The first silicon atom is bonded to the nitrogen atom in the interface termination region 40. The nitrogen atom in the interface termination region 40 is bonded to the silicon atom in the gate insulating layer 28. The silicon atom in the gate insulating layer 28 is bonded to the oxygen atom in the gate insulating layer 28.

The percentage of the first silicon atom among a plurality of silicon atoms present in the first layer, which is the uppermost layer of the first face P1 of the silicon carbide layer 10, is equal to or more than 90%. The first face P1 of the silicon carbide layer 10 has the first surface structure as a main surface structure.

Among the plurality of silicon atoms present in the first layer that is the uppermost layer of the first face P1 of the silicon carbide layer 10, silicon atoms other than the first silicon atom may include, for example, a second silicon atom or a third silicon atom. The first face P1 of the silicon carbide layer 10 may include, for example, a second surface structure or a third surface structure.

The gate electrode 30 is provided on the gate insulating layer 28. The gate insulating layer 28 is interposed between the gate electrode 30 and the silicon carbide layer 10. The gate insulating layer 28 is interposed between the gate electrode 30 and the drift region 14. The gate insulating layer 28 is interposed between the gate electrode 30 and the p-well region 16.

The gate electrode 30 is, for example, polycrystalline silicon containing n-type impurities or p-type impurities.

The length of the gate electrode 30 in the second direction is, for example, equal to or more than 0.5 μm and equal to or less than 2.0 μm. The channel length of the MOSFET 100 is, for example, equal to or more than 0.5 μm and equal to or less than 2.0 μm.

The interlayer insulating film 32 is formed on the gate electrode 30. The interlayer insulating film 32 is disposed between the gate electrode 30 and the source electrode 34. The interlayer insulating film 32 is, for example, a silicon oxide film.

The source electrode 34 is electrically connected to the source region 18 and the p-well contact region 20. The source electrode 34 also functions as a p-well electrode for applying an electric potential to the p-well region 16. The source electrode 34 is in contact with, for example, the source region 18 and the p-well contact region 20.

The source electrode 34 has, for example, a stacked structure of a barrier metal layer of nickel (Ni) and a metal layer of aluminum on the barrier metal layer. The barrier metal layer of nickel and the silicon carbide layer may react with each other to form nickel silicide (NiSi, Ni$_2$Si, and the like). The barrier metal layer formed of nickel and the metal layer formed of aluminum may form an alloy by reaction.

The drain electrode 36 is provided on a side of the silicon carbide layer 10 opposite to the source electrode 34, that is, on the back surface side of the silicon carbide layer 10. The drain electrode 36 is electrically connected to the drain region 12. The drain electrode 36 is in contact with, for example, the drain region 12.

The drain electrode 36 is, for example, nickel. Nickel may react with the drain region 12 to form nickel silicide (NiSi, Ni$_2$Si, and the like).

In addition, in the first embodiment, the n-type impurity is, for example, nitrogen or phosphorus. Arsenic (As) or antimony (Sb) can also be applied as an n-type impurity.

In addition, in the first embodiment, the p-type impurity is, for example, aluminum. Boron (B), gallium (Ga), and indium (In) can also be applied as p-type impurities.

Figure 10A:
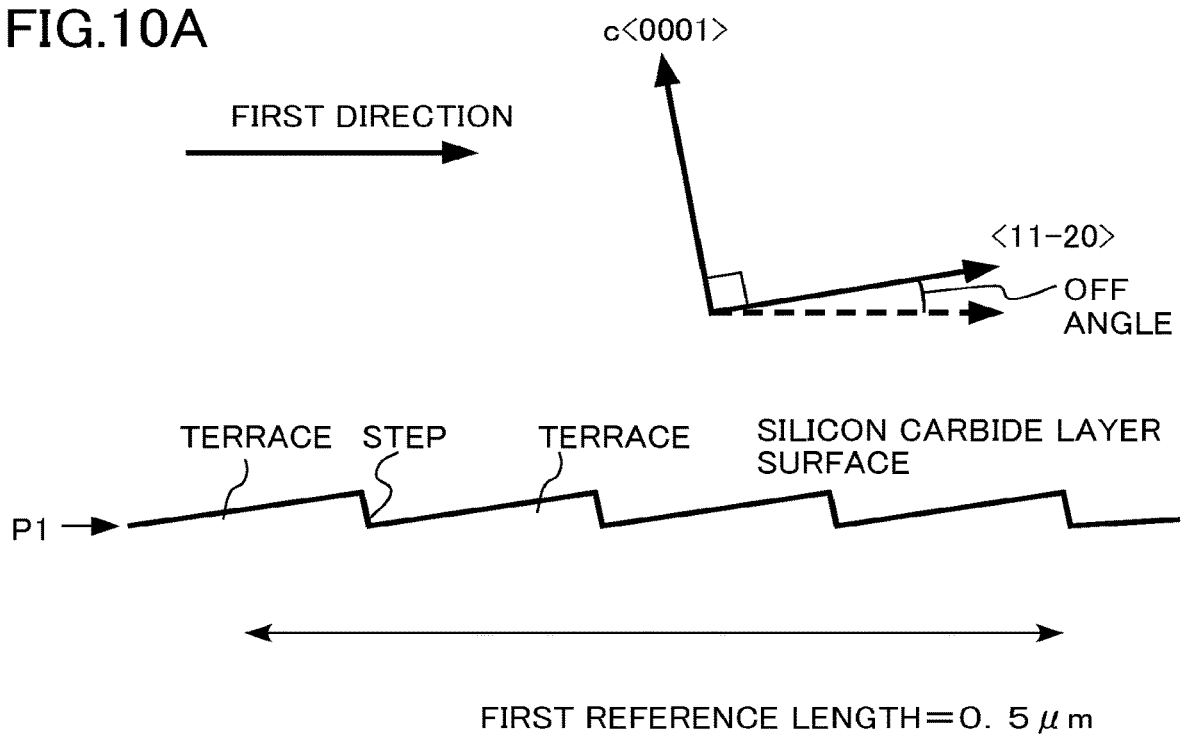
FIGS. 10A and 10B are explanatory diagrams of the surface of a silicon carbide layer of the semiconductor device of the first embodiment.
Figure 10B:
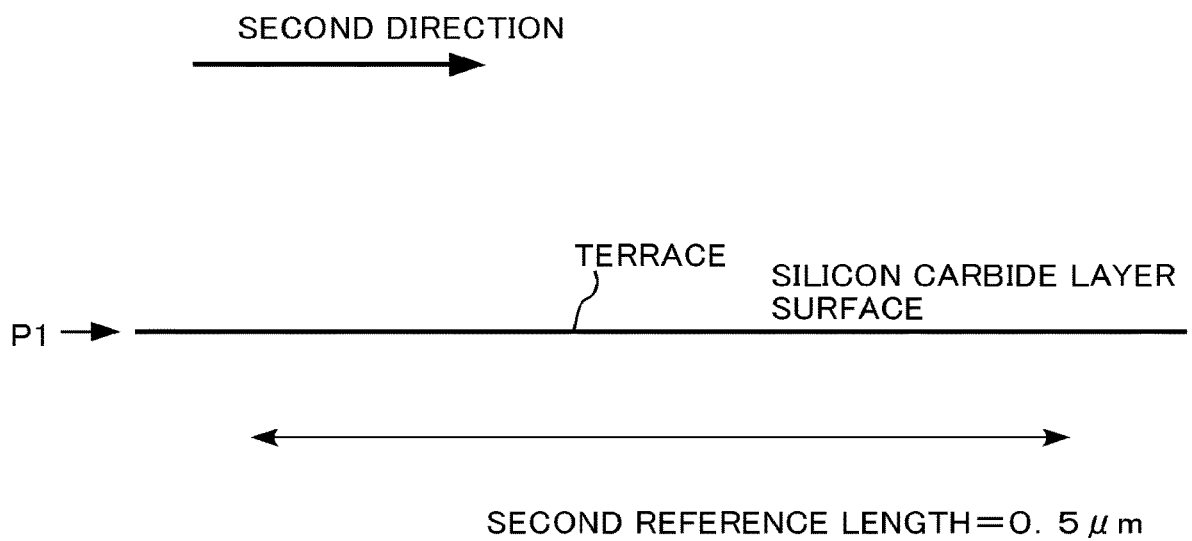

FIGS. 10A and 10B are explanatory diagrams of the surface of a silicon carbide layer of the semiconductor device of the first embodiment. FIGS. 10A and 10B are enlarged views of the surface of the p-well region 16 facing the gate electrode 30.

FIG. 10A is a cross-sectional view parallel to the first direction, and FIG. 10B is a cross-sectional view parallel to the second direction. That is, FIG. 10A is a cross-sectional view taken along the channel width direction of the MOSFET 100, and FIG. 10B is a cross-sectional view taken along the channel length direction of the MOSFET 100.

As shown in FIG. 10A, the surface of the p-well region 16 in the channel width direction is configured by a plurality of terraces and steps between the terraces. The reason why the plurality of terraces are formed in the p-well region 16 in the channel width direction is that the first face P1 has an off angle inclined in the first direction with respect to the {0001} face. On the other hand, as shown in FIG. 10B, the surface of the p-well region 16 in the channel length direction is configured by a single terrace, and there is no step.

Figure 11:
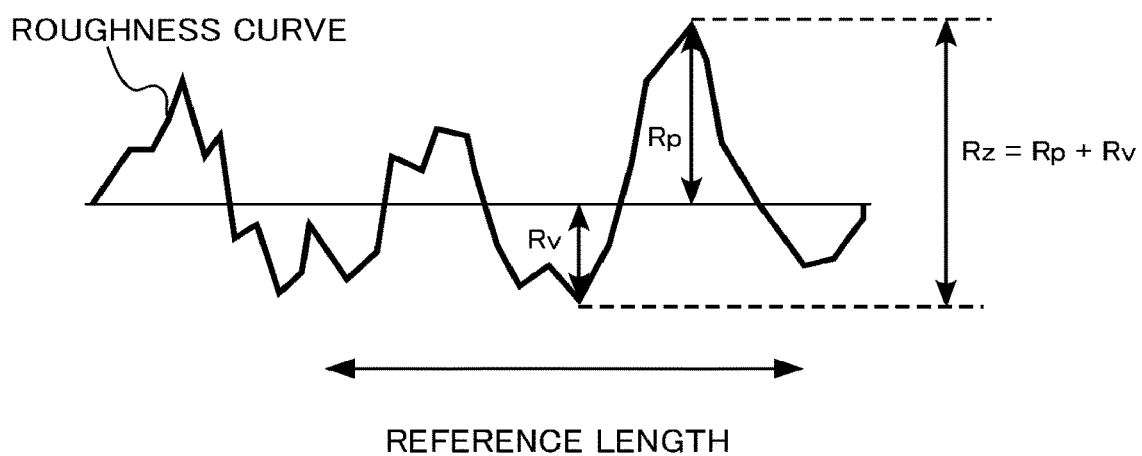
FIG. 11 is an explanatory diagram of the definition of surface roughness (Rz)

FIG. 11 is an explanatory diagram of the definition of surface roughness (Rz).

The surface roughness (Rz) is calculated as a value of the sum of the height (Rp) of the highest portion and the depth (Rv) of the deepest portion by extracting a part of the roughness curve measured by a roughness meter, such as an AFM, as a reference length.

When the first reference length in the first direction is 0.5 μm, the surface roughness (Rz) of the surface of the p-well region 16 in the range of the first reference length is equal to or less than 1 nm. The height of the step is preferably approximately 0.5 nm or approximately 1 nm. In addition, when the second reference length in the second direction is 0.5 μm, the surface roughness (Rz) of the surface of the p-well region 16 in the range of the second reference length is equal to or less than 0.5 nm.

Next, an example of a semiconductor device manufacturing method of the first embodiment will be described.

A semiconductor device manufacturing method of the first embodiment includes: performing a first heat treatment on a silicon carbide layer with a surface having an off angle equal to or more than 0° and equal to or less than 8° with respect to a {0001} face in an atmosphere containing a hydrogen gas at a temperature equal to or more than 900° C. and equal to or less than 1400° C.; performing a second heat treatment in an atmosphere containing fluorine at a temperature equal to or more than 900° C. and equal to or less than 1400° C.; forming a silicon oxide film on the silicon carbide layer; performing a third heat treatment in an atmosphere containing nitrogen; and forming a gate electrode on the silicon oxide film.

Figure 12:
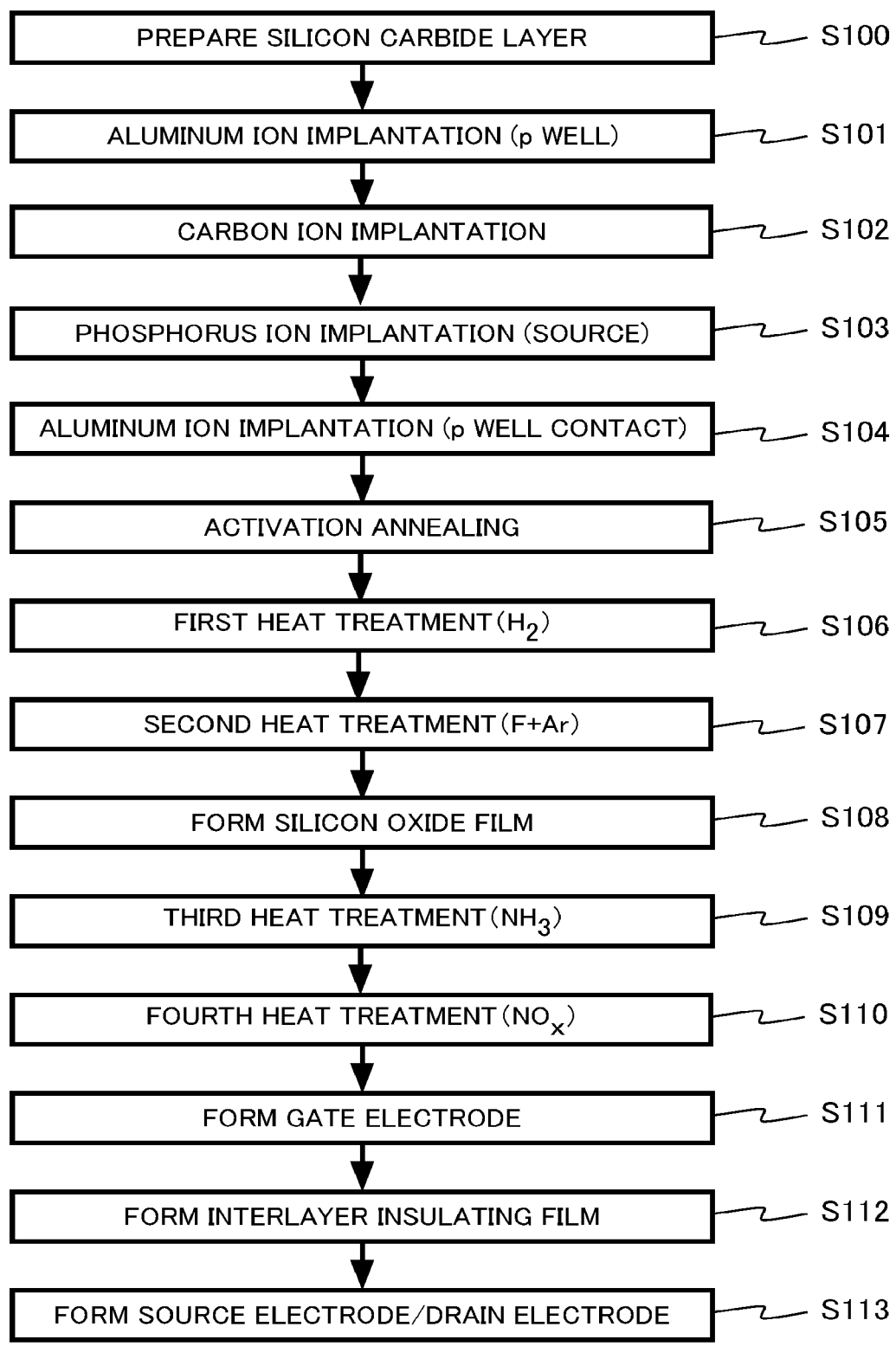
FIG. 12 is a process flow diagram of a semiconductor device manufacturing method of the first embodiment.

FIG. 12 is a process flow diagram of the semiconductor device manufacturing method of the first embodiment. FIGS. 13 to 24 are explanatory diagrams of the semiconductor device manufacturing method of the first embodiment. FIGS. 13 to 15, and 17 to 24 are cross-sectional views during the manufacturing process. FIG. 16 is a diagram showing the element distribution immediately after ion implantation.

As shown in FIG. 12, the semiconductor device manufacturing method of the first embodiment includes silicon carbide layer preparation (step S100), aluminum ion implantation (step S101), carbon ion implantation (step S102), phosphorus ion implantation (step S103), aluminum ion implantation (step S104), activation annealing (S105), first heat treatment (step S106), second heat treatment (step S107), silicon oxide film formation (step S108), third heat treatment (step S109), fourth heat treatment (step S110), gate electrode formation (step S111), interlayer insulating film formation (step S112), and source electrode/drain electrode formation (step S113).

Figure 13:
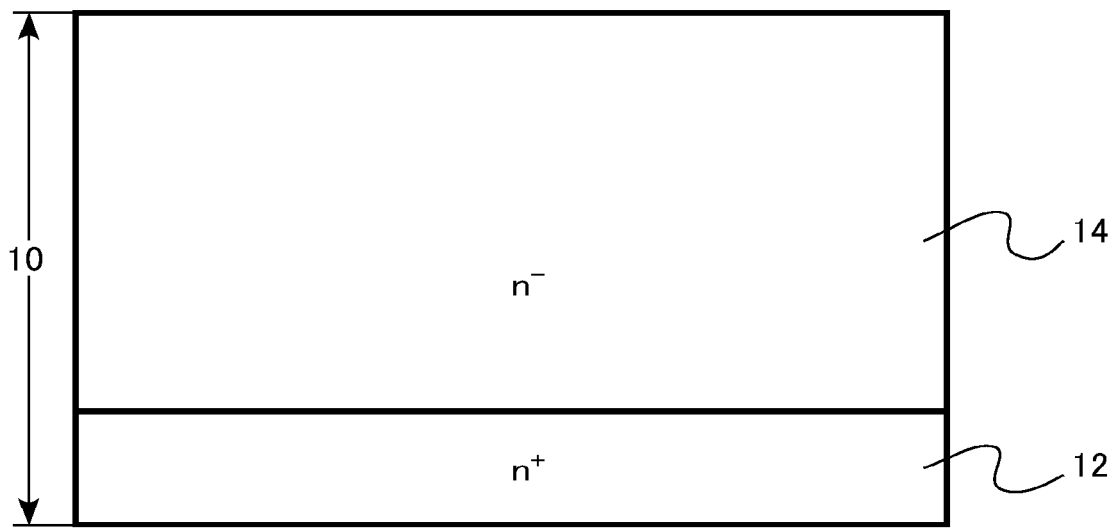
FIG. 13 is an explanatory diagram of the semiconductor device manufacturing method of the first embodiment.

In step S100, the silicon carbide layer 10 is prepared (FIG. 13). The silicon carbide layer 10 includes an n⁺-type drain region 12 and an n⁻-type drift region 14.

The drift region 14 is formed, for example, on the drain region 12 by an epitaxial growth method.

The drain region 12 contains nitrogen as an n-type impurity. The n-type impurity concentration in the drain region 12 is, for example, equal to or more than $1 \times 10^1$ cm$^{-3}$ and equal to or less than $1 \times 10^{21}$ cm$^{-3}$.

The drift region 14 contains nitrogen as an n-type impurity. The n-type impurity concentration in the drift region 14 is, for example, equal to or more than $1 \times 10^{15}$ cm$^{-3}$ and equal to or less than $2 \times 10^{16}$ cm$^{-3}$. The thickness of the drift region 14 is, for example, equal to or more than 5 μm and equal to or less than 100 μm.

Figure 14:
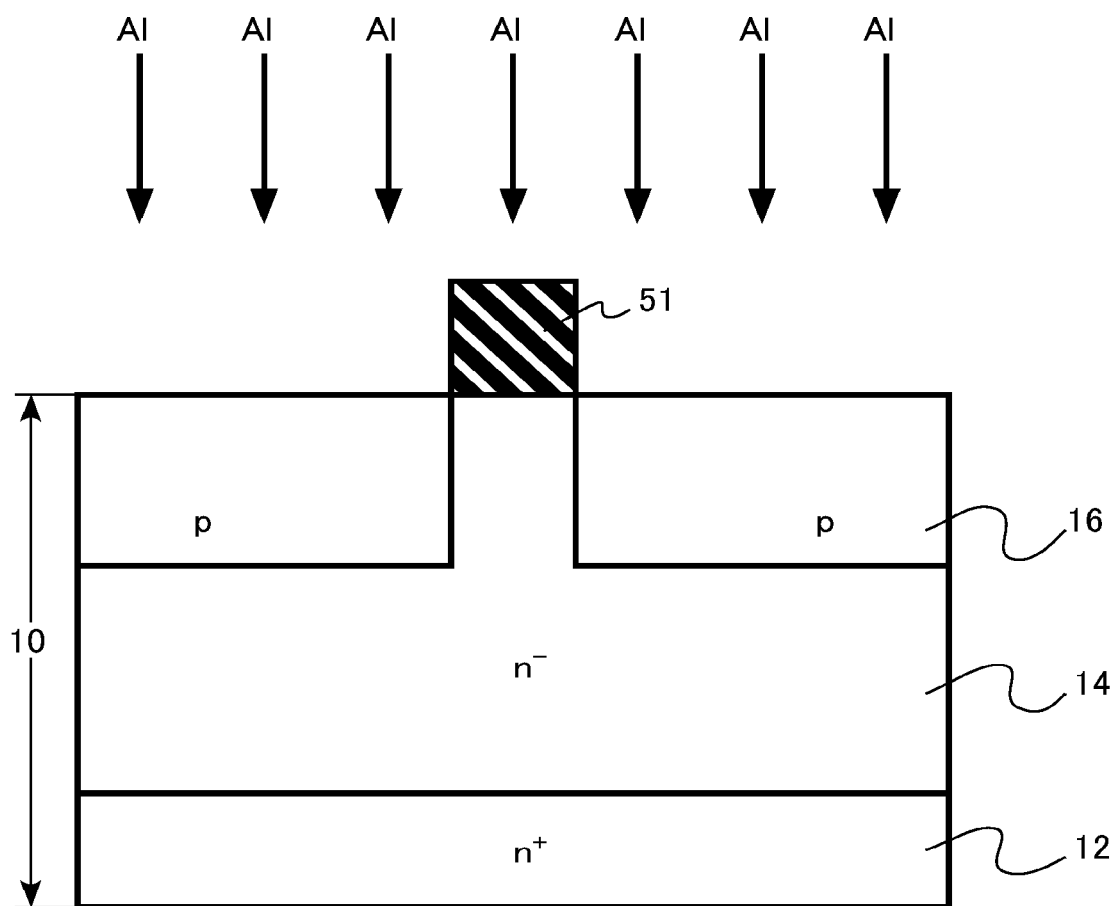
FIG. 14 is an explanatory diagram of the semiconductor device manufacturing method of the first embodiment.

In step S101, a first mask material 51 is formed, for example, by forming an insulating film and patterning the insulating film by photolithography and etching. Then, by using the first mask material 51 as an ion implantation mask, aluminum is ion-implanted into the drift region 14. The p-well region 16 is formed by ion implantation (FIG. 14).

Ion implantation for forming the p-well region 16 is an example of the first ion implantation. Aluminum ion implantation is performed in a first projected range with a first dose amount. The projected range is an average projection range.

The first projected range is, for example, equal to or more than 0.1 μm and equal to or less than 0.6 μm. The first dose amount is, for example, equal to or more than $1 \times 10^{12}$ cm$^{-2}$ and equal to or less than $1 \times 10^{14}$ cm$^{-2}$.

Figure 15:
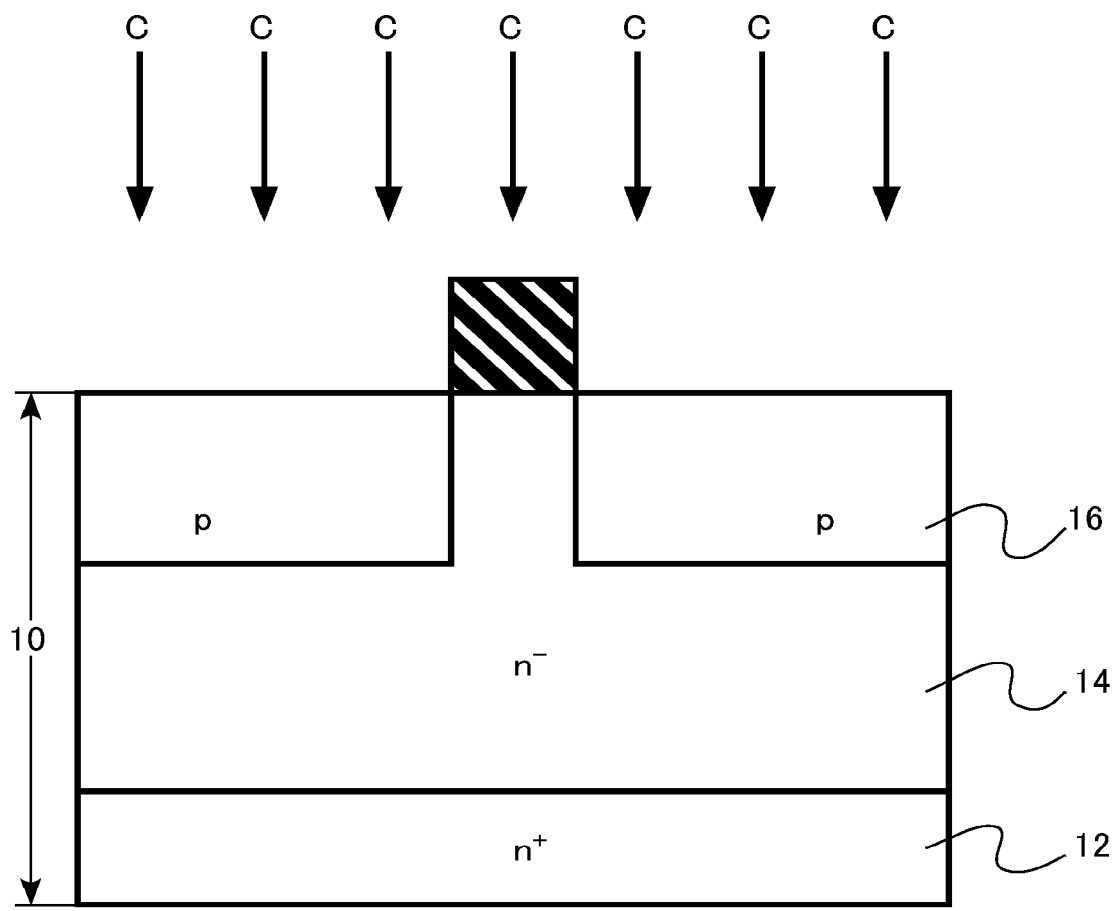
FIG. 15 is an explanatory diagram of the semiconductor device manufacturing method of the first embodiment.
Figure 16:
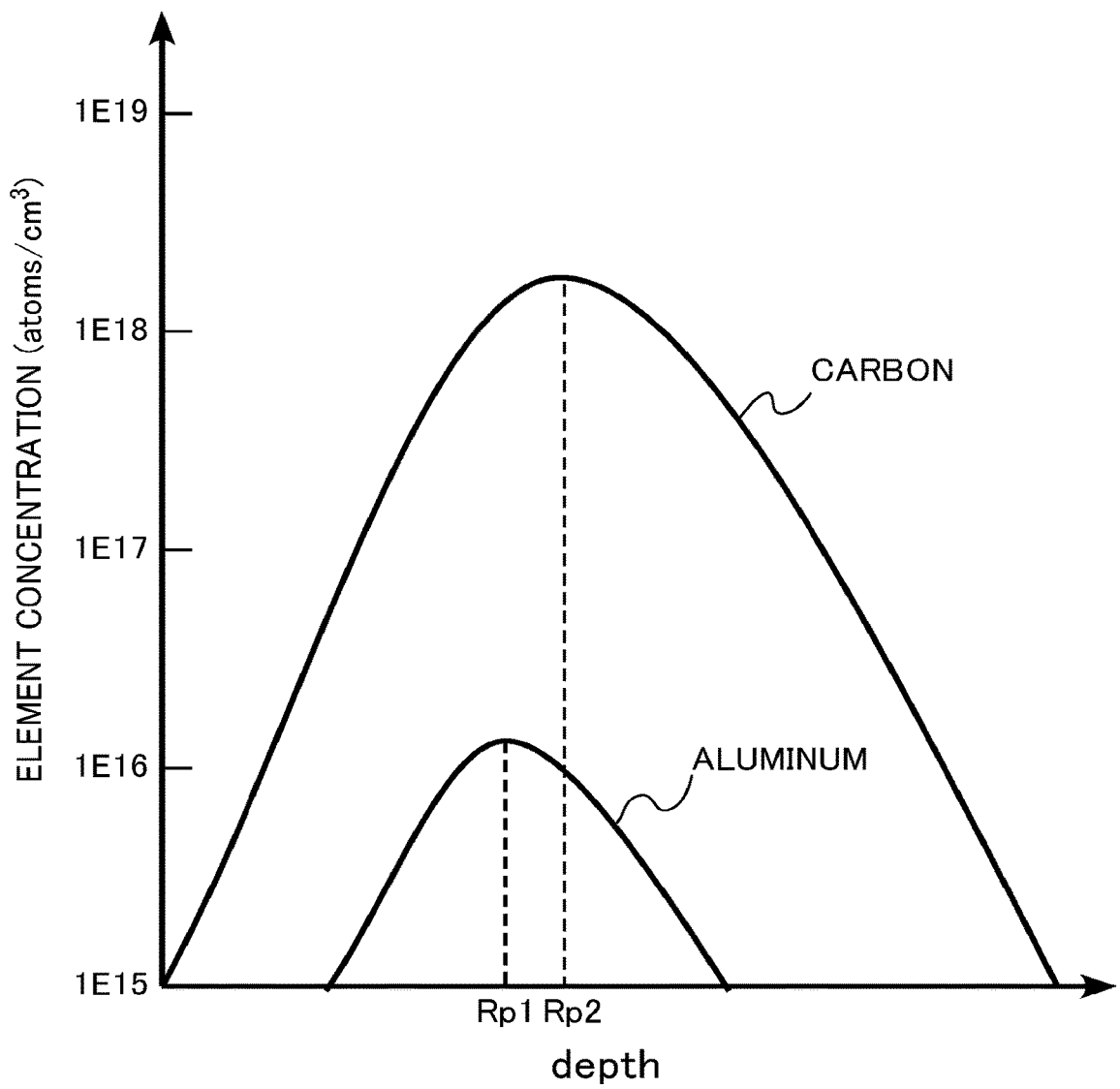
FIG. 16 is an explanatory diagram of the semiconductor device manufacturing method of the first embodiment.

In step S102, carbon is ion-implanted into the p-well region 16 by using the first mask material 51 as an ion implantation mask (FIG. 15). Carbon ion implantation into the p-well region 16 is an example of the second ion implantation. Carbon ion implantation is performed in a second projected range with a second dose amount. The aluminum ion implantation and the carbon ion implantation are performed in a same region of the silicon carbide layer 10. Thereafter, the first mask material 51 is removed.

The second projected range is, for example, equal to or more than 0.1 μm and equal to or less than 0.6 μm. The second projected range is, for example, equal to or more than 80% and equal to or less than 120% of the first projected range. The second dose amount is equal to or more than 10 times the first dose amount. The second dose amount is, for example, equal to or less than 1000 times the first dose amount. The second dose amount is, for example, equal to or more than $1 \times 10^{15}$ cm$^{-2}$ and equal to or less than $1 \times 10^{18}$ cm$^{-2}$.

FIG. 16 shows the concentration distribution of aluminum implanted into the silicon carbide layer 10 by the first ion implantation and the concentration distribution of carbon implanted into the silicon carbide layer 10 by the second ion implantation. FIG. 16 shows the element distribution immediately after ion implantation.

As shown in FIG. 16, a second projected range Rp2 for carbon ion implantation is disposed in the vicinity of the first projected range Rp1 for aluminum ion implantation. Since the second dose amount of carbon ion implantation is equal to or more than 10 times the first dose amount of aluminum ion implantation, the carbon concentration distribution after ion implantation completely covers, for example, the aluminum concentration distribution after ion implantation.

The peak concentration of the aluminum distribution is, for example, equal to or more than $1 \times 10^{16}$ cm$^{-3}$ and equal to or less than $1 \times 10^{20}$ cm$^{-3}$. The peak concentration of the carbon distribution is, for example, equal to or more than $1 \times 10^{18}$ cm$^{-3}$ and equal to or less than $1 \times 10^{22}$ cm$^{-3}$.

Figure 17:
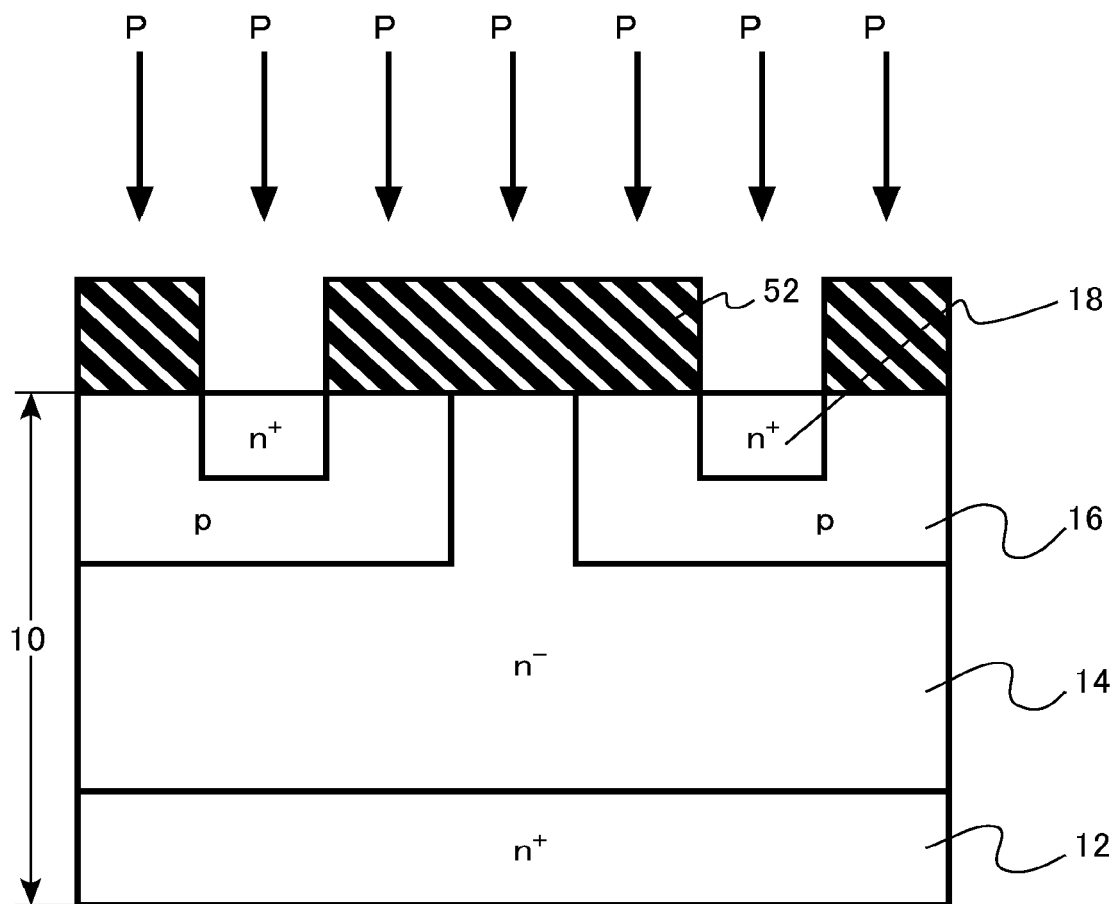
FIG. 17 is an explanatory diagram of the semiconductor device manufacturing method of the first embodiment.

In step S103, a second mask material 52 is formed, for example, by forming an insulating film and patterning the insulating film by photolithography and etching. Then, by using the second mask material 52 as an ion implantation mask, phosphorus is ion-implanted into the drift region 14 to form the source region 18 (FIG. 17). Thereafter, the second mask material 52 is removed.

Figure 18:
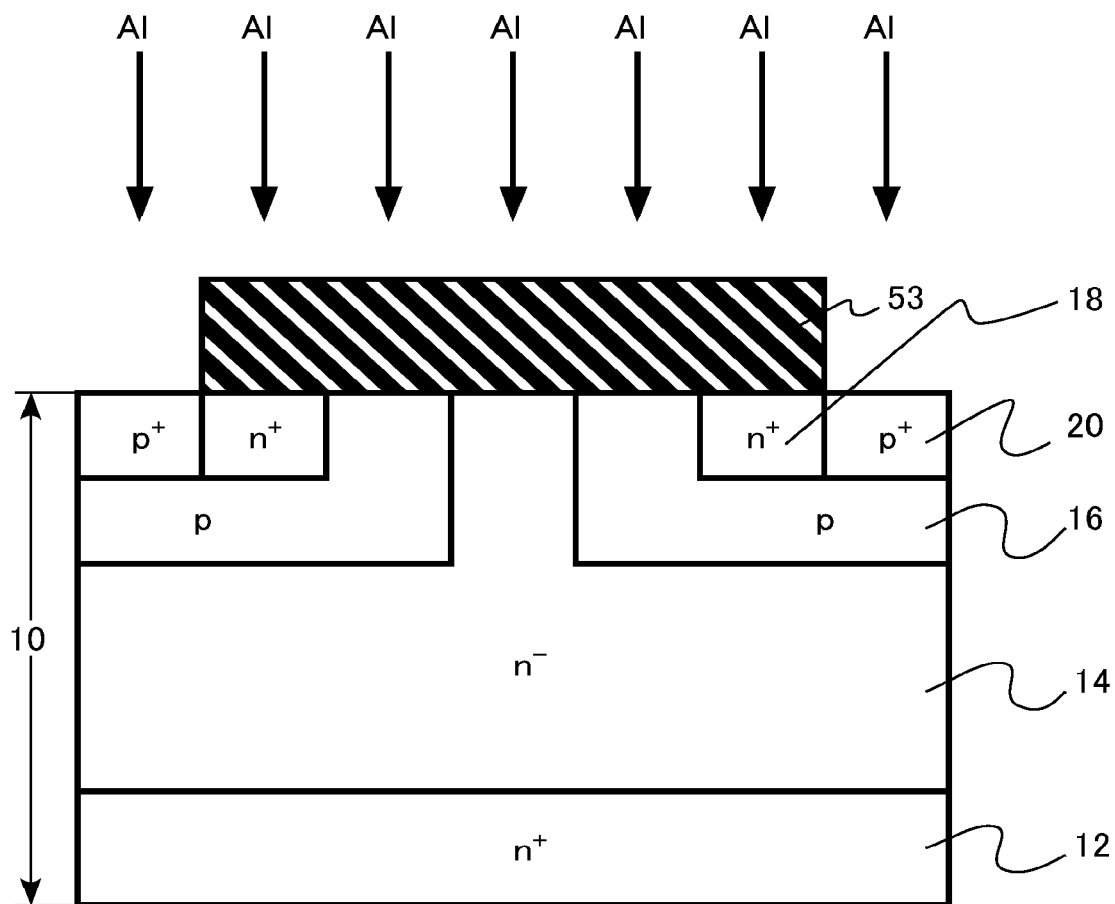
FIG. 18 is an explanatory diagram of the semiconductor device manufacturing method of the first embodiment.

In step S104, a third mask material 53 is formed, for example, by forming an insulating film and patterning the insulating film by photolithography and etching. By using the third mask material 53 as an ion implantation mask, aluminum is ion-implanted into the drift region 14 to form the p-well contact region 20 (FIG. 18).

Figure 19:
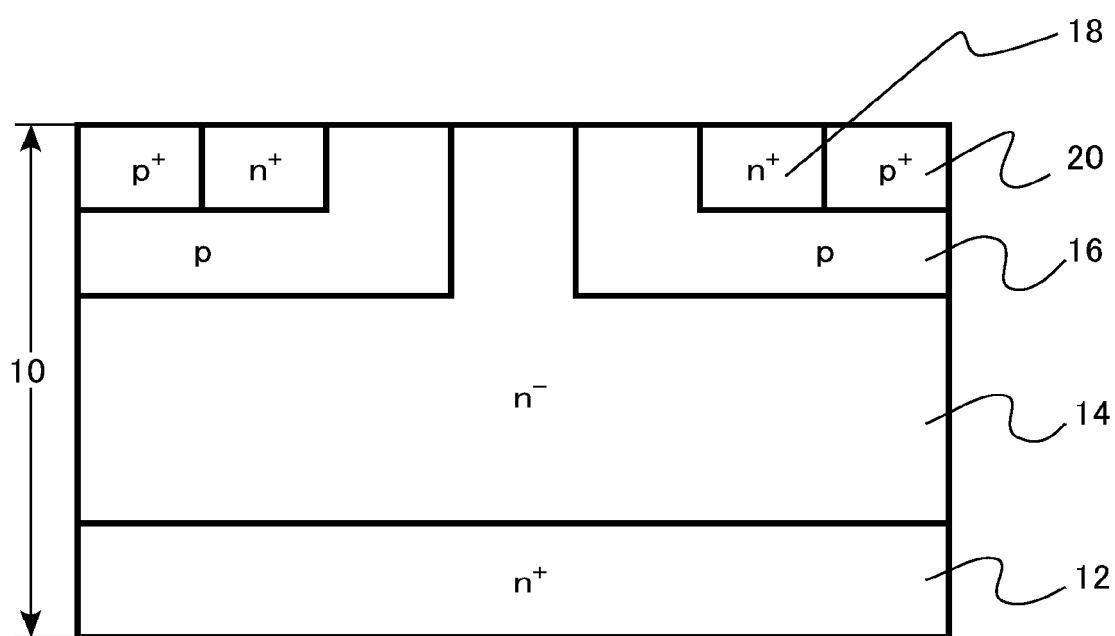
FIG. 19 is an explanatory diagram of the semiconductor device manufacturing method of the first embodiment.
Figure 20:
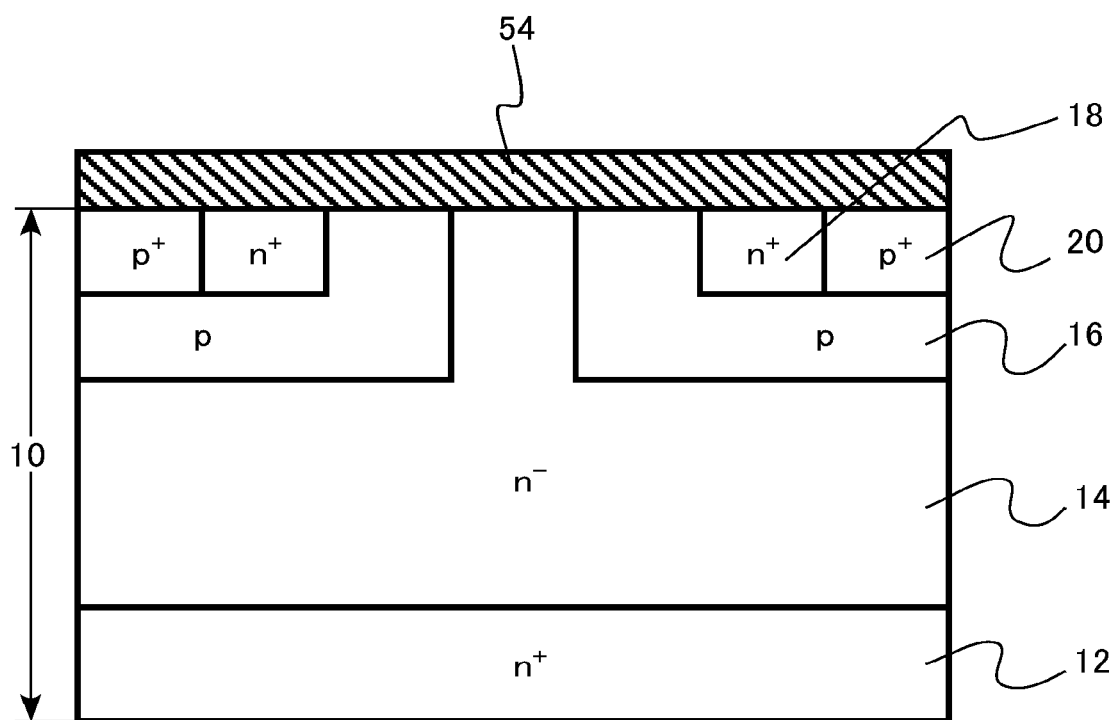
FIG. 20 is an explanatory diagram of the semiconductor device manufacturing method of the first embodiment.

Then, the third mask material 53 is removed (FIG. 19). Then, a carbon film 54 is formed on the silicon carbide layer 10 (FIG. 20).

In step S105, activation annealing is performed. Activation annealing is performed at a temperature equal to or more than 1600° C. and equal to or less than 1800° C. The activation annealing is performed in a non-oxidizing atmosphere. The activation annealing is performed, for example, in an inert gas atmosphere. The activation annealing is performed, for example, in an argon gas atmosphere.

By the activation annealing, aluminum and phosphorus ion-implanted into the silicon carbide layer 10 are activated. The activation annealing is activation annealing of aluminum and phosphorus. In addition, by the activation annealing, the interstitial carbon formed by carbon ion implantation into the silicon carbide layer 10 fills the carbon vacancies in the silicon carbide layer 10.

The carbon film 54 suppresses the desorption of silicon or carbon from the silicon carbide layer 10 into the atmosphere during the activation annealing. In addition, the carbon film 54 absorbs excess interstitial carbon in the silicon carbide layer 10 during the activation annealing.

The activation annealing includes, for example, a first step whose temperature is equal to or more than 1600° C. and a second step whose temperature is lower than the temperature of the first step. The temperature of the second step is, for example, equal to or less than 1000° C.

For example, in the first step, aluminum and phosphorus ion-implanted into the silicon carbide layer 10 are activated, so that the interstitial carbon fills the carbon vacancies. For example, in the second step of low temperature, excess interstitial carbon is expelled from the silicon carbide layer 10 and absorbed by the carbon film 54.

Figure 21:
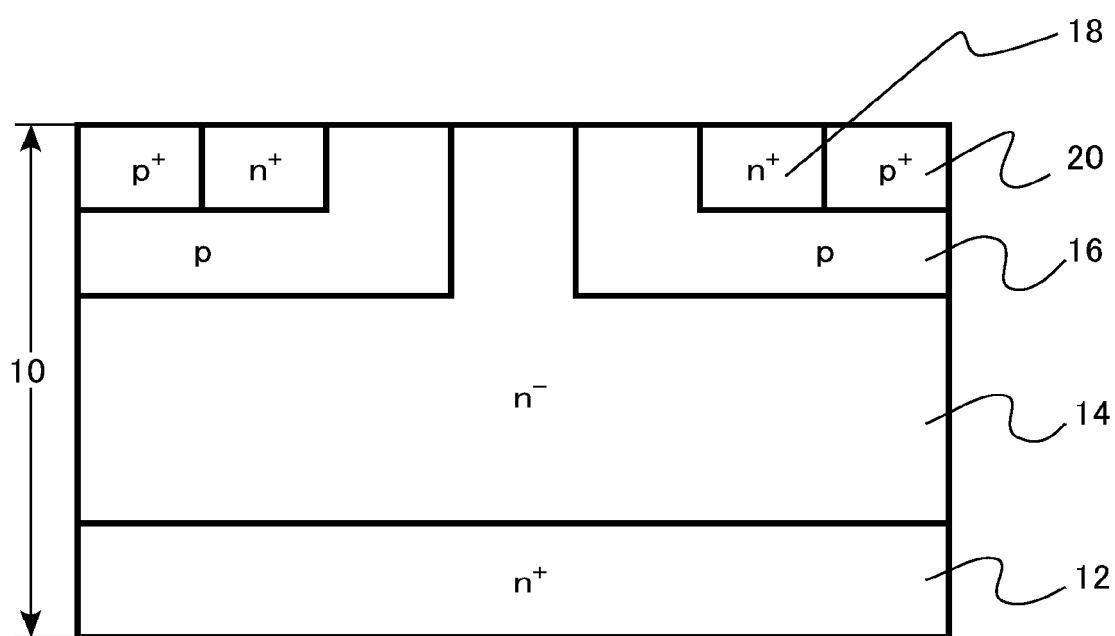
FIG. 21 is an explanatory diagram of the semiconductor device manufacturing method of the first embodiment.

Then, the carbon film 54 is removed (FIG. 21).

In step S106, a first heat treatment is performed. The first heat treatment is performed at a temperature equal to or more than 900° C. and equal to or less than 1400° C. The first heat treatment is performed in an atmosphere containing hydrogen. The first heat treatment is performed, for example, in an atmosphere containing hydrogen gas.

By the first heat treatment, the oxide film on the surface of the silicon carbide layer 10 is etched. The surface of the silicon carbide layer 10 is exposed by the first heat treatment. By the first heat treatment, the silicon atom on the outermost surface of the silicon carbide layer 10 has a dangling bond.

In step S107, a second heat treatment is performed. The second heat treatment is performed at a temperature equal to or more than 900° C. and equal to or less than 1400° C. The second heat treatment is performed in an atmosphere containing fluorine.

The fluorine contained in the atmosphere during the second heat treatment is, for example, atomic fluorine produced by using the heating catalyst method. The heating catalyst method is a technique for producing atomic fluorine by supplying fluorine gas onto a high-temperature tungsten filament, for example.

In addition, the fluorine contained in the atmosphere during the second heat treatment is, for example, a fluorine gas.

For example, argon gas or nitrogen gas is contained in the atmosphere of the second heat treatment.

Due to the fluorine contained in the atmosphere during the second heat treatment, the dangling bond of the silicon atom on the outermost surface of the silicon carbide layer 10 is terminated by the fluorine atom.

During the second heat treatment, termination of the dangling bond by the fluorine atom and migration of the atom on the exposed surface of the silicon carbide layer 10 occur at the same time.

By the second heat treatment, a second surface structure is formed on the surface of the silicon carbide layer 10. The surface of the silicon carbide layer 10 has the second surface structure as a main surface structure. Since the silicon atom terminated by the fluorine atom is positively charged up, the second surface structure in which the negatively charged carbon is disposed directly below the positively charged silicon atom is greatly stabilized. The silicon atom disposed in the first layer of the outermost surface of the second surface structure is the second silicon atom. The site position of the second silicon atom is the same as the site position of the silicon atom in the third layer from the first face P1, and is the same as the site position of the silicon atom in the fifth layer from the first face P1.

The temperature of the second heat treatment is, for example, lower than the temperature of the first heat treatment.

Figure 22:
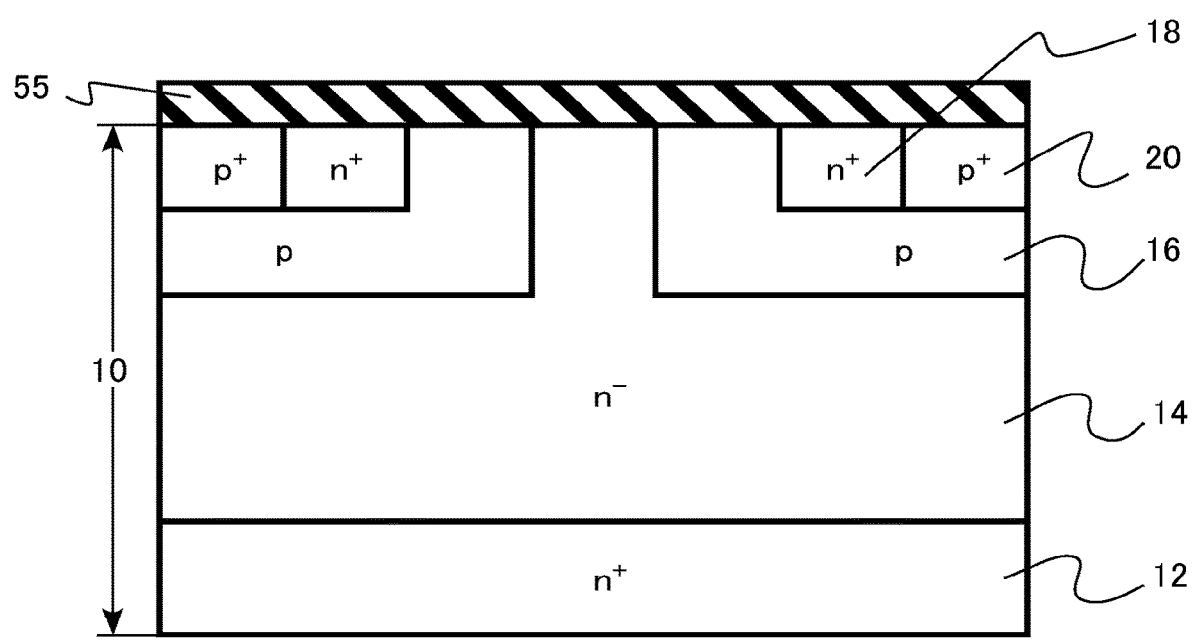
FIG. 22 is an explanatory diagram of the semiconductor device manufacturing method of the first embodiment.

In step S108, a silicon oxide film 55 is formed on the silicon carbide layer 10 (FIG. 22). The silicon oxide film 55 finally becomes the gate insulating layer 28.

The silicon oxide film 55 is formed by using, for example, a vapor deposition method. The silicon oxide film 55 is formed by using, for example, a chemical vapor deposition method (CVD method) or a physical vapor deposition method (PVD method). The formation temperature of the silicon oxide film 55 is, for example, equal to or less than 600° C.

The silicon oxide film 55 is a sedimentary film. The thickness of the silicon oxide film 55 is, for example, equal to or more than 30 nm and equal to or less than 100 nm.

The silicon oxide film 55 is, for example, a silicon oxide film formed by a CVD method using tetraethyl orthosilicate (TEOS) as a source gas. In addition, the silicon oxide film 55 is, for example, a silicon oxide film formed by a CVD method using dichlorosilane gas ($SiH_2Cl_2$) and nitrous oxide gas ($N_2O$) as source gases.

In step S109, a third heat treatment is performed. The third heat treatment is performed in an atmosphere containing ammonia gas ($NH_3$).

For example, the ammonia gas ($NH_3$) is supplied to a reaction furnace containing the silicon carbide layer 10 to perform heat treatment.

The temperature of the third heat treatment is, for example, equal to or more than 1200° C. and equal to or less than 1600° C. The partial pressure of the ammonia gas in the atmosphere of the third heat treatment is, for example, equal to or more than 90%.

Figure 23:
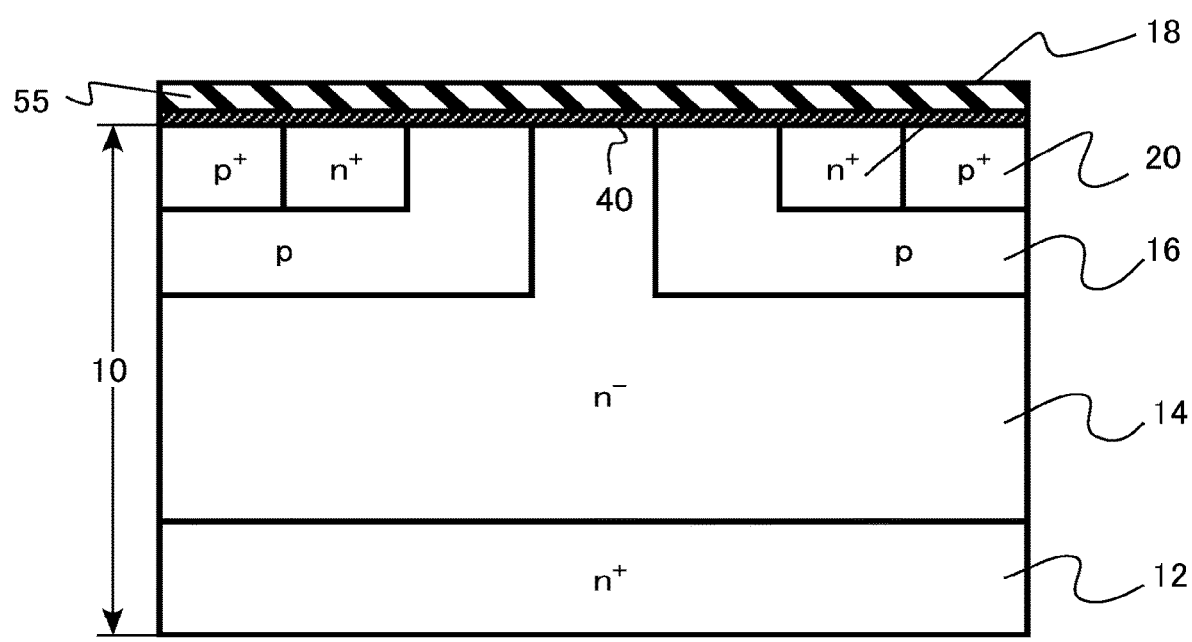
FIG. 23 is an explanatory diagram of the semiconductor device manufacturing method of the first embodiment.

By the third heat treatment, the interface termination region 40 is formed at the interface between the silicon carbide layer 10 and the silicon oxide film (FIG. 23). By the third heat treatment, the surface of the silicon carbide layer 10 is converted into the first surface structure.

The third heat treatment also functions as densify annealing of the silicon oxide film. By the third heat treatment, the silicon oxide film 55 becomes a high-density film.

In step S110, a fourth heat treatment is performed. The fourth heat treatment is performed in an atmosphere containing nitrogen oxide gas (NOx). The nitrogen oxide gas is, for example, a nitric oxide gas (NO). In addition, the nitrogen oxide gas is, for example, a nitrous oxide gas ($N_2O$).

For example, the nitrogen oxide gas (NOx) is supplied to a reaction furnace containing the silicon carbide layer 10 to perform heat treatment.

The temperature of the fourth heat treatment is, for example, equal to or more than 750° C. and equal to or less than 1050° C. The temperature of the fourth heat treatment is, for example, lower than the temperature of the third heat treatment.

The partial pressure of the nitrogen oxide gas in the atmosphere of the fourth heat treatment is, for example, equal to or more than 10%.

By the fourth heat treatment, nitrogen in the silicon oxide film is removed. By the fourth heat treatment, a silicon oxide film with reduced nitrogen defects is formed.

By the third heat treatment, the interface termination region 40 is formed at the interface between the silicon carbide layer 10 and the silicon oxide film (FIG. 23), while a large amount of nitrogen is introduced into the silicon oxide film. The interface termination increases the oxidation resistance of the interface. Therefore, by the fourth heat treatment, the interface is not oxidized even if oxygen is introduced, and the nitrogen defects in the silicon oxide film can be replaced by oxidation. That is, by the fourth heat treatment, it is possible to obtain a silicon oxide film with good characteristics, which has reduced nitrogen defects or oxygen deficiency by removing nitrogen in the silicon oxide film while avoiding interface oxidation.

In step S111, the gate electrode 30 is formed on the gate insulating layer 28. The gate electrode 30 is, for example, polycrystalline silicon containing n-type impurities or p-type impurities.

Figure 24:
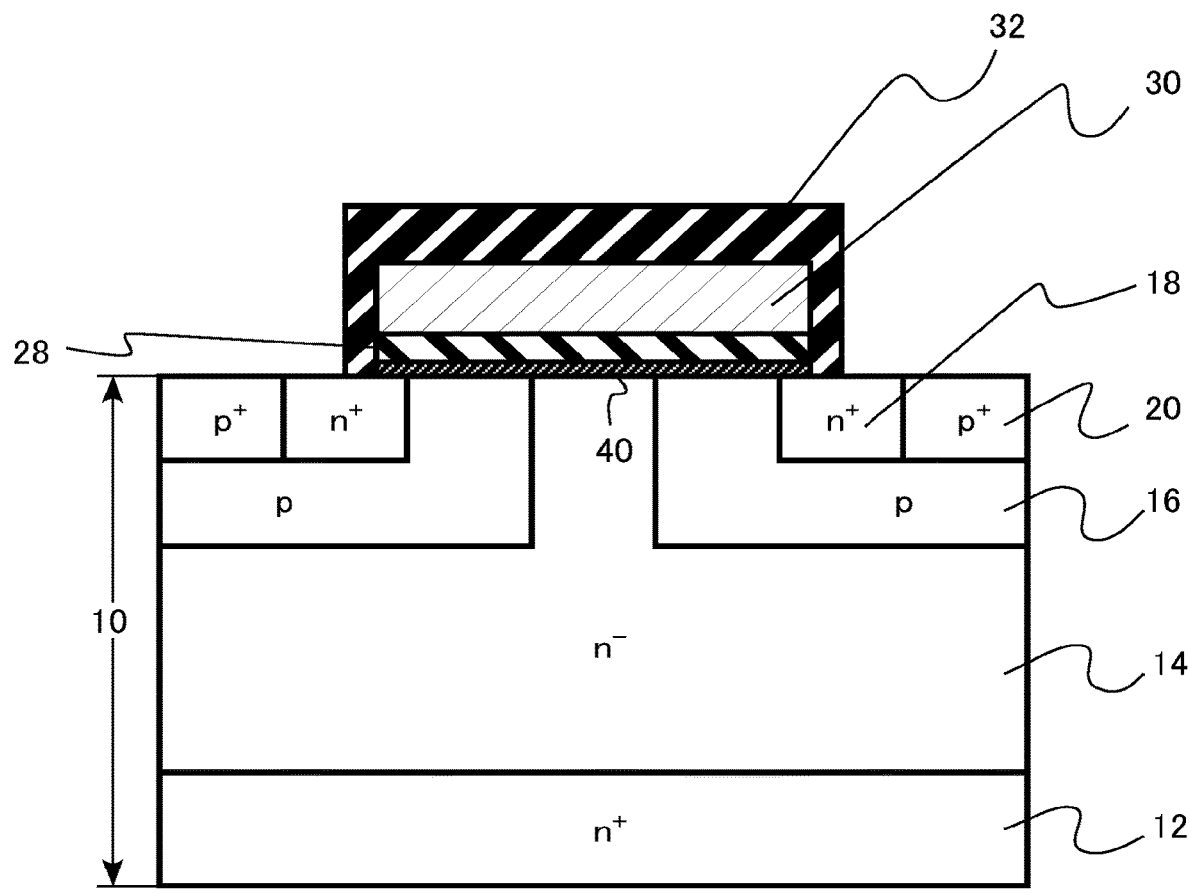
FIG. 24 is an explanatory diagram of the semiconductor device manufacturing method of the first embodiment.

In step S112, the interlayer insulating film 32 is formed on the gate electrode 30 (FIG. 24). The interlayer insulating film 32 is, for example, a silicon oxide film.

In step S113, the source electrode 34 and the drain electrode 36 are formed. The source electrode 34 is formed on the source region 18 and the p-well contact region 20. The source electrode 34 is formed, for example, by sputtering nickel (Ni) and aluminum (Al). The drain electrode 36 is formed on the back surface side of the silicon carbide layer 10. The drain electrode 36 is formed, for example, by sputtering nickel.

By the manufacturing method described above, the MOSFET 100 shown in FIGS. 1, 3, and 4 is formed.

Next, the function and effect of the semiconductor device and the semiconductor device manufacturing method of the first embodiment will be described.

In the MOSFET 100 of the first embodiment, the main surface structure of the surface of the silicon carbide layer 10 is the first surface structure having a small interface state between the silicon carbide layer 10 and the gate insulating layer 28. Therefore, the decrease in the reliability of the gate insulating layer due to the interface state or the decrease in the mobility of carriers due to the interface state is suppressed. In addition, the interface termination region 40 in which nitrogen is segregated is provided between the silicon carbide layer 10 and the gate insulating layer 28. Therefore, since the dangling bond on the surface of the silicon carbide layer 10 is reduced, the decrease in the mobility of carriers is suppressed. As a result, the characteristics of the MOSFET 100 are improved.

In addition, in the method of manufacturing the MOSFET 100 of the first embodiment, in order for the first surface structure having a small interface state to be the main surface structure, the second surface structure is formed on the surface of the silicon carbide layer 10 during the manufacturing process. Then, by converting the second surface structure into the first surface structure, the first surface structure finally becomes the main surface structure.

Hereinafter, the function and effect of the semiconductor device and the semiconductor device manufacturing method of the first embodiment will be described in detail.

FIGS. 25A, 25B, and 25C are explanatory diagrams of the function and effect of the semiconductor device of the first embodiment. FIGS. 25A, 25B, and 25C are diagrams showing the result of calculating the energy state of each surface structure of the silicon carbide layer shown in FIGS. 6A, 6B, and 6C by first principle calculation. FIG. 25A shows the case of the first surface structure shown in FIG. 6A, FIG. 25B shows the case of the second surface structure shown in FIG. 6B, and FIG. 25C shows the case of the third surface structure shown in FIG. 6C.

FIGS. 25A, 25B, and 25C show band diagrams of each surface structure. FIGS. 25A, 25B, and 25C show calculation results for a state in which the silicon carbide layer (SiC) and the silicon oxide layer ($SiO_2$) are ideally bonded to each other.

As shown in FIG. 25A, in the case of the first surface structure, no interface state is formed between the silicon carbide layer (SiC) and the silicon oxide layer ($SiO_2$).

On the other hand, as shown in FIG. 25B, in the case of the second surface structure, the interface state is formed at a position 1.2 eV higher than the lower end of the conduction band of the silicon carbide layer (Sic). In the case of the MOS structure, a leakage current of the gate insulating layer through the interface state may be generated to decrease the reliability of the gate insulating layer.

In addition, as shown in FIG. 25C, in the case of the third surface structure, the interface state is formed at a position 0.3 eV lower than the lower end of the conduction band of the silicon carbide layer (SiC). In the case of the MOSFET, electrons may be trapped at the interface state to decrease the mobility of carriers. From the above calculation results, it can be seen that it is desirable that the surface of the silicon carbide layer has a first surface structure in order to improve the characteristics of the MOSFET.

In the MOSFET 100 of the first embodiment, the percentage of the first silicon atom among a plurality of silicon atoms present in the first layer, which is the uppermost layer of the first face P1, is equal to or more than 90%. Therefore, 90% or more of the surface of the silicon carbide layer 10 has the first surface structure. As a result, the decrease in the reliability of the gate insulating layer 28 due to the interface state or the decrease in the mobility of carriers due to the interface state is suppressed, so that the characteristics of the MOSFET 100 are improved.

From the viewpoint of suppressing the decrease in the reliability of the gate insulating layer 28 or the decrease in the mobility of carriers, the percentage of the first silicon atom among a plurality of silicon atoms present in the first layer, which is the uppermost layer of the first face P1, is preferably equal to or more than 95%, more preferably equal to or more than 98%.

In the MOSFET 100, as shown in FIG. 10A, when the first reference length in the channel width direction is 0.5 μm, the surface roughness (Rz) of the surface of the p-well region 16 in the range of the first reference length is equal to or less than 1 nm. The height of the step is preferably approximately 0.5 nm or approximately 1 nm. In addition, in the MOSFET 100, as shown in FIG. 10B, when the second reference length in the channel width direction is 0.5 μm, the surface roughness (Rz) of the surface of the p-well region 16 in the range of the second reference length is equal to or less than 0.5 nm.

In the MOSFET 100, there is no large unevenness, such as step bunching, on the surface of the p-well region 16 in which a channel is formed. Therefore, the scattering of carriers due to the unevenness of the surface of the p-well region 16 is suppressed. As a result, the mobility of carriers in the MOSFET 100 is improved.

In particular, as shown in FIG. 10B, it is preferable that the unevenness in the channel length direction, which is the traveling direction of carriers, is small.

Even if the surface of the silicon carbide layer 10 has the first surface structure, it is difficult in manufacturing to make the bonding state between the silicon carbide layer 10 and the gate insulating layer 28 perfect. On the surface of the silicon carbide layer 10, dangling bonds of silicon atoms or carbon atoms can occur. When a dangling bond is present on the surface of the silicon carbide layer 10, an interface state is formed at the interface between the silicon carbide layer 10 and the gate insulating layer 28, resulting in a decrease in the mobility of carriers.

The MOSFET 100 of the first embodiment includes the interface termination region 40 where nitrogen is segregated between the silicon carbide layer 10 and the gate insulating layer 28. In the interface termination region 40, the dangling bond is reduced by bonding the nitrogen atom to the silicon atom in a tri-coordinate bond. Therefore, a MOSFET in which a decrease in the mobility of carriers is suppressed is realized.

The nitrogen concentration in the interface termination region 40 is equal to or more than $1 \times 10^{21}$ cm$^{-3}$. From the viewpoint of suppressing the decrease in the mobility of carriers in the MOSFET 100, the nitrogen concentration in the interface termination region 40 is preferably equal to or more than $1 \times 10^{22}$ cm$^{-3}$, more preferably equal to or more than $5 \times 10^{22}$ cm$^{-3}$. From the viewpoint of suppressing the decrease in the mobility of carriers in the MOSFET 100, the peak nitrogen concentration in the interface termination region 40 of the nitrogen concentration distribution is preferably equal to or more than $1 \times 10^{22}$ cm$^{-3}$, more preferably equal to or more than $5 \times 10^{22}$ cm$^{-3}$.

Excess nitrogen in the interface termination region 40 may become a charge trap. Therefore, the peak nitrogen concentration in the interface termination region 40 of the nitrogen concentration distribution is preferably equal to or less than $4 \times 10^{23}$ cm$^{-3}$, more preferably equal to or less than $1 \times 10^{23}$ cm$^{-3}$.

The peak nitrogen concentration in the interface termination region 40 of the nitrogen concentration distribution is preferably $5.0 \times 10^{22}$ cm$^{-3}$+5%. When the peak nitrogen concentration is in the range of $5.0 \times 10^{22}$ cm$^{-3}$+5%, the MOSFET 100 exhibits good characteristics, especially with few charge traps.

The area density of nitrogen in the interface termination region 40 is preferably equal to or more than $1 \times 10^{14}$ cm$^{-2}$ and equal to or less than $2.5 \times 10^{15}$ cm-2. The area density of nitrogen in the interface termination region 40 is preferably $1.4 \times 10^{15}$ cm$^{-2}$±5%. When the area density of nitrogen is in the above range, the MOSFET 100 exhibits good characteristics, especially with few charge traps.

From the viewpoint of suppressing the decrease in the mobility of carriers in the MOSFET 100, it is preferable that 90% or more of the nitrogen atoms present in the interface termination region 40 are tri-coordinated nitrogen atoms. More preferably, 998 or more of the nitrogen atoms present in the interface termination region 40 are tri-coordinated nitrogen atoms. The concentration of tri-coordinated nitrogen atoms present in the interface termination region 40 is, for example, equal to or more than $1 \times 10^{21}$ cm$^{-3}$. The concentration of four-coordinated nitrogen atoms present in the interface termination region 40 is, for example, equal to or less than $1 \times 10^{19}$ cm$^{-3}$.

From the viewpoint of suppressing the decrease in the threshold voltage of the MOSFET 100, the concentration of four-coordinated nitrogen atoms is preferably equal to or less than $1 \times 10^{18}$ cm$^{-3}$, more preferably equal to or less than $1 \times 10^{1}$/cm$^{-3}$.

The interface termination region 40 is formed by supplying nitrogen to the interface between the silicon carbide layer 10 and the gate insulating layer 28 after forming the gate insulating layer 28. The interface termination region 40 is formed by substituting the carbon atom in the uppermost layer of the surface of the silicon carbide layer 10 with the nitrogen atom. At this time, the silicon atom in the uppermost layer is bonded to the oxygen atom in the gate insulating layer 28 to become a part of the gate insulating layer 28.

Figure 26:
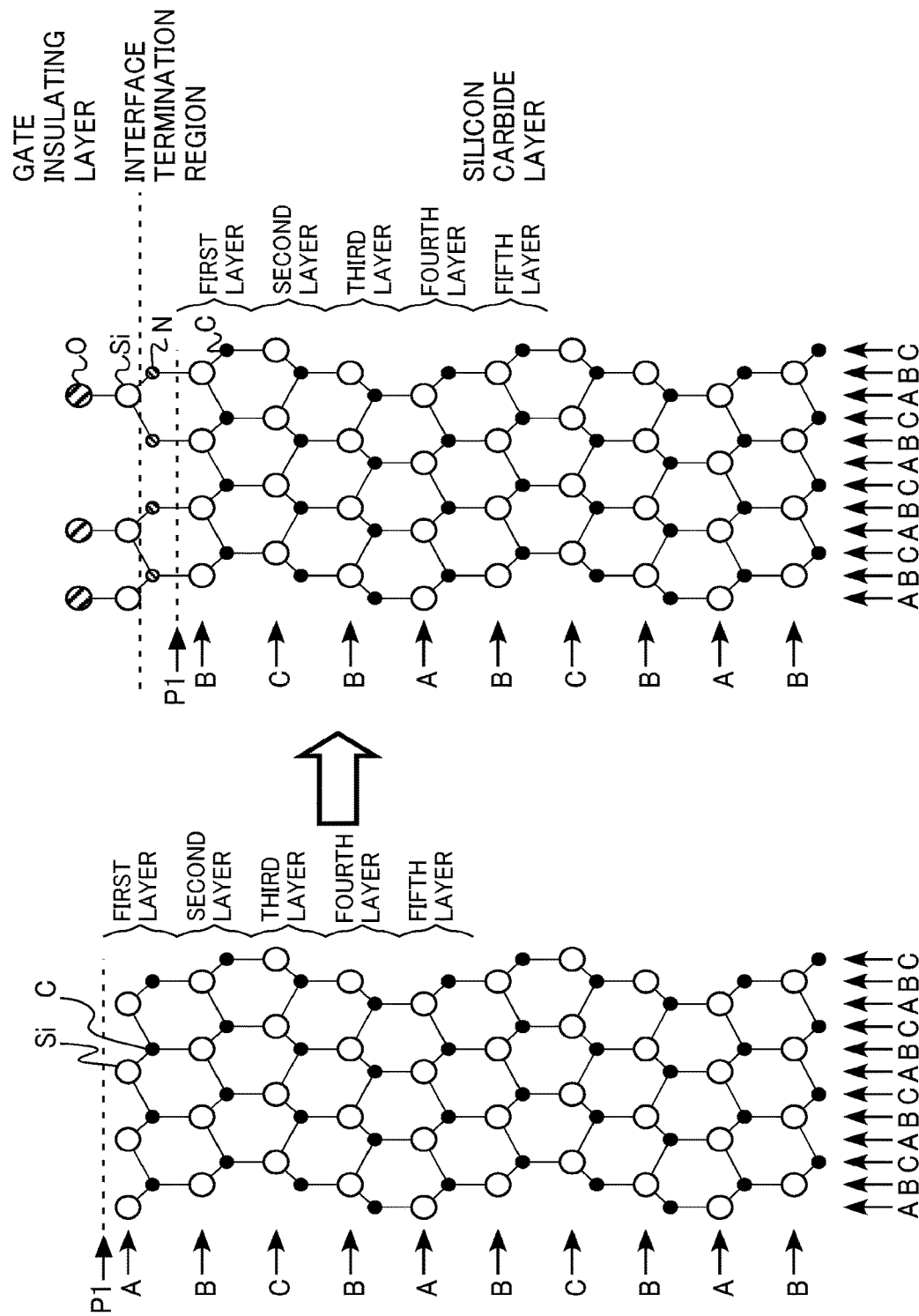
FIG. 26 is an explanatory diagram of the function and effect of the semiconductor device of the first embodiment.

FIG. 26 is an explanatory diagram of the function and effect of the semiconductor device of the first embodiment. FIG. 26 is a diagram showing a change in a surface structure when a gate insulating layer and an interface termination region are formed on the surface of a silicon carbide layer having a first surface structure.

As shown in FIG. 26, when forming the interface termination region, the carbon atom in the first layer that is the uppermost layer is substituted by the nitrogen atom. The silicon atom in the first layer that is the uppermost layer is bonded to the oxygen atom in the gate insulating layer to become a part of the gate insulating layer. Before the interface termination region is formed, the silicon atom in the first layer is a first silicon atom as shown on the left side of FIG. 26. On the other hand, after the interface termination region is formed, the silicon atom in the first layer is a second silicon atom as shown on the right side of FIG. 26. In other words, after the interface termination region is formed, the surface of the silicon carbide layer is converted from the first surface structure to the second surface structure.

Figure 27:
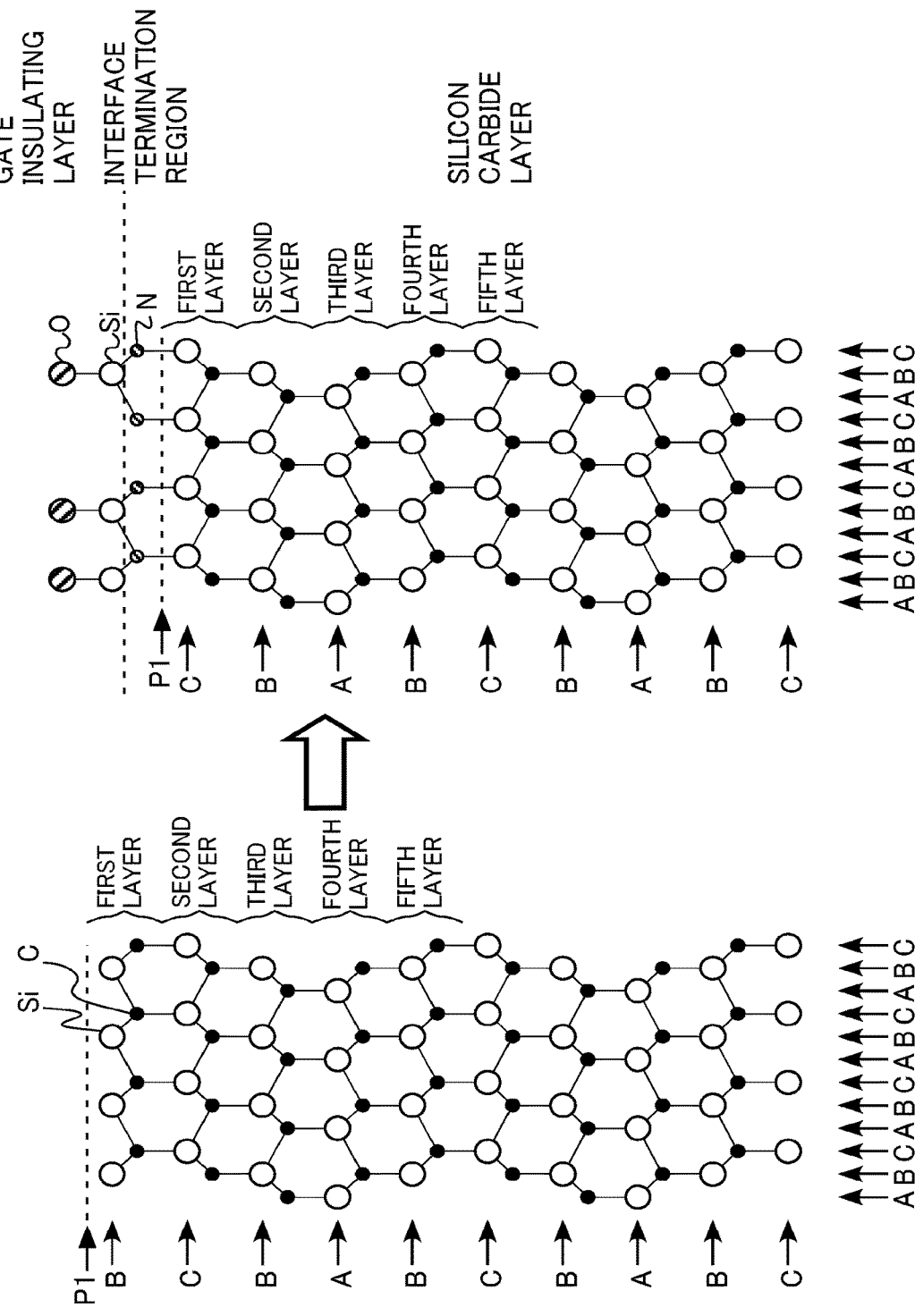
FIG. 27 is an explanatory diagram of the function and effect of the semiconductor device of the first embodiment.

FIG. 27 is an explanatory diagram of the function and effect of the semiconductor device of the first embodiment. FIG. 27 is a diagram showing a change in a surface structure when a gate insulating layer and an interface termination region are formed on the surface of a silicon carbide layer having a second surface structure.

As shown in FIG. 27, when forming the interface termination region, the carbon atom in the first layer that is the uppermost layer is substituted by the nitrogen atom. The silicon atom in the first layer that is the uppermost layer is bonded to the oxygen atom in the gate insulating layer to become a part of the gate insulating layer. Before the interface termination region is formed, the silicon atom in the first layer is a second silicon atom as shown on the left side of FIG. 27. On the other hand, after the interface termination region is formed, the silicon atom in the first layer is a first silicon atom as shown on the right side of FIG. 27. In other words, after the interface termination region is formed, the surface of the silicon carbide layer is converted from the second surface structure to the first surface structure.

Figure 28:
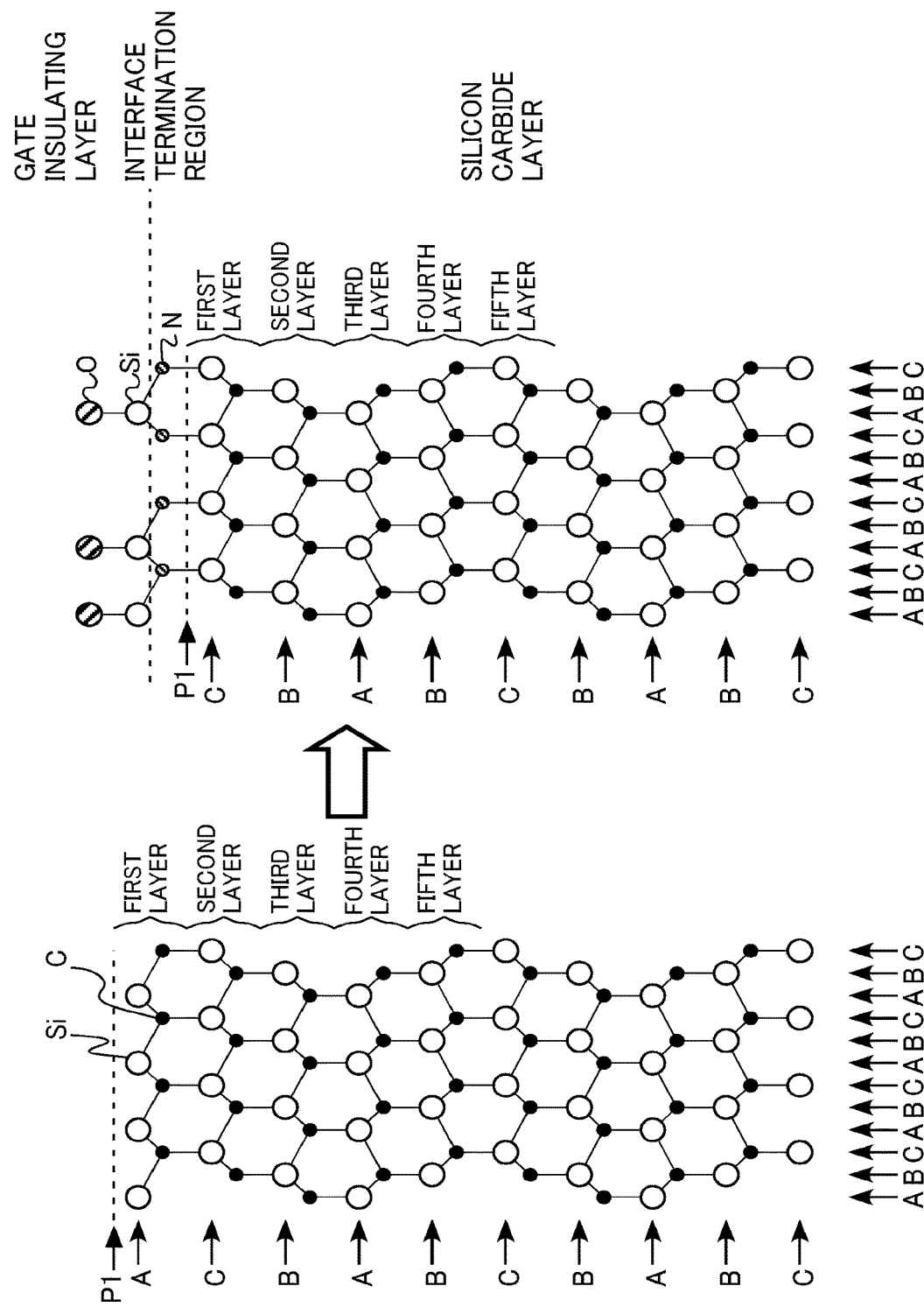
FIG. 28 is an explanatory diagram of the function and effect of the semiconductor device of the first embodiment.

FIG. 28 is an explanatory diagram of the function and effect of the semiconductor device of the first embodiment. FIG. 28 is a diagram showing a change in a surface structure when a gate insulating layer and an interface termination region are formed on the surface of a silicon carbide layer having a third surface structure.

As shown in FIG. 28, when forming the interface termination region, the carbon atom in the first layer that is the uppermost layer is substituted by the nitrogen atom. The silicon atom in the first layer that is the uppermost layer is bonded to the oxygen atom in the gate insulating layer to become a part of the gate insulating layer. Before the interface termination region is formed, the silicon atom in the first layer is a third silicon atom as shown on the left side of FIG. 28. On the other hand, after the interface termination region is formed, the silicon atom in the first layer is a first silicon atom as shown on the right side of FIG. 28. In other words, after the interface termination region is formed, the surface of the silicon carbide layer is converted from the third surface structure to the first surface structure.

As described above, from the viewpoint of improving the characteristics of the MOSFET, it is preferable that the surface of the silicon carbide layer has a first surface structure, and it is not preferable that the surface of the silicon carbide layer has a second surface structure or a third surface structure.

As described with reference to FIGS. 26, 27, and 28, in order to make the surface of the silicon carbide layer have a first surface structure after forming the interface termination region, the surface of the silicon carbide layer needs to have a second surface structure or a third surface structure before forming the interface termination region.

In the method of manufacturing the MOSFET 100 of the first embodiment, the first heat treatment is performed in step S106 before the interface termination region is formed. The first heat treatment is performed in an atmosphere containing hydrogen at a temperature equal to or more than 900° C.

By the first heat treatment, the oxide film on the surface of the silicon carbide layer 10 is etched. By etching the oxide film on the surface of the silicon carbide layer 10, dangling bonds of a large number of silicon atoms are formed on the surface of the silicon carbide layer 10.

The temperature of the first heat treatment is preferably equal to or more than 1000° C., more preferably equal to or more than 1100° C., and even more preferably equal to or more than 1200° C. As the first temperature increases, the etching of the oxide film on the surface of the silicon carbide layer 10 is promoted.

After the first heat treatment, a second heat treatment is performed in step S107. The second heat treatment is performed at a temperature equal to or more than 900° C.

and equal to or less than 1400° C. The second heat treatment is performed in an atmosphere containing fluorine.

During the second heat treatment, termination of the dangling bond by the fluorine atom and migration of the atom on the exposed surface of the silicon carbide layer 10 occur at the same time.

By the second heat treatment, a second surface structure is formed on the surface of the silicon carbide layer 10. The surface of the silicon carbide layer 10 has the second surface structure as a main surface structure.

By the first principle calculation of the inventors, it has become clarified that, when the dangling bond of the silicon atom is terminated by the fluorine atom, electrons are attracted to the side of the fluorine atom and accordingly the amount of positive charge of the silicon atom increases. It has become clarified that, since the dangling bond of the silicon atom is terminated by the fluorine atom, the amount of positive charge per atom increases by about 1.7e ($e=1.60217662\times10^{-19}$ coulomb, which is an elementary charge).

The carbon atom in the silicon carbide layer 10 has a negative charge. Therefore, when the termination of the dangling bond by the fluorine atom and the migration of the atom on the exposed surface of the silicon carbide layer 10 occur at the same time during the second heat treatment, a structure in which the silicon atom having a large positive charge amount and the carbon atom are close to each other is the most stable.

The second surface structure is a structure in which the carbon atom of the second layer is disposed directly below the silicon atom of the first layer as shown in FIG. 6B. Therefore, in the second surface structure, the distance from the silicon atom on the outermost surface to the carbon atom on the lower surface is shorter than that in the first surface structure and the third surface structure. As a result, during the second heat treatment, the second surface structure is formed as a stable structure on the surface of the silicon carbide layer 10.

The fluorine contained in the atmosphere during the second heat treatment is preferably atomic fluorine produced by using the heating catalyst method. By using the heating catalyst method, the concentration of atomic fluorine in the atmosphere increases, and accordingly, the termination of the dangling bond by the fluorine atom is promoted.

In the method of manufacturing the MOSFET 100 of the first embodiment, the second heat treatment is performed in an atmosphere containing fluorine. For example, when a large step is present on the surface of the silicon carbide layer during the second heat treatment, fluorine is adsorbed on the step, surface migration is promoted, and the large step on the surface disappears. Therefore, by performing the second heat treatment in an atmosphere containing fluorine, for example, the occurrence of step bunching is suppressed, and the unevenness of the surface of the silicon carbide layer is reduced.

The temperature of the second heat treatment is preferably equal to or more than 1000° C., more preferably equal to or more than 1050° C., and even more preferably equal to or more than 1100° C. As the temperature of the second heat treatment increases, the migration of atoms on the surface of the silicon carbide layer 10 is promoted.

The temperature of the second heat treatment is preferably equal to or less than 1300° C., more preferably equal to or less than 1200° C. As the temperature of the second heat treatment decreases, the termination of the dangling bond by the fluorine atom is promoted.

The temperature of the second heat treatment is preferably lower than the temperature of the first heat treatment.

When a large number of carbon vacancies are present in the silicon carbide layer 10 during the second heat treatment, fluorine atoms supplied from the atmosphere may enter the carbon vacancies. When fluorine atoms enter the carbon vacancies, charge traps are formed. Therefore, electrons in the MOSFET may be trapped to decrease the mobility of carriers.

Therefore, in the method of manufacturing the MOSFET 100 of the first embodiment, carbon is ion-implanted into the p-well region 16 in step S102. The p-well region 16 is formed by aluminum ion implantation in step S101. A large amount of carbon vacancies are formed in the p-well region 16 by aluminum ion implantation.

A large amount of carbon vacancies formed by aluminum ion implantation are eliminated by carbon ion implantation into the p-well region 16. By setting the second dose amount of carbon to 10 times or more the first dose amount of aluminum, a large amount of carbon vacancies are eliminated.

Since the carbon vacancies in the p-well region 16 are reduced, the scattering of carriers due to the fluorine atoms entering the carbon vacancies is suppressed. Therefore, the mobility of carriers in the MOSFET 100 is further improved.

From the viewpoint of appropriately maintaining the concentration of p-type impurities in the p-well region 16, it is preferable that the first dose amount of aluminum is equal to or less than $1\times10^{14}$ cm$^{-2}$. From the viewpoint of reducing the amount of carbon vacancies in the p-well region 16, the second dose amount of carbon is preferably equal to or more than $1\times10^{15}$ cm$^{-2}$, more preferably equal to or more than $1\times10^{16}$ cm$^{-2}$.

From the viewpoint of reducing the amount of carbon vacancies in the p-well region 16, it is preferable that the second dose amount of carbon is equal to or more than 100 times the first dose amount of aluminum.

From the viewpoint of reducing the amount of carbon vacancies in the p-well region 16, the second projected range Rp2 of carbon ion implantation is preferably equal to or more than 80% and equal to or less than 120% of the first projected range Rp1 of aluminum ion implantation, more preferably equal to or more than 90% and equal to or less than 110% of the first projected range Rp1 of aluminum ion implantation.

By bringing the first projected range Rp1 and the second projected range Rp2 closer to each other, it becomes easy for the carbon concentration distribution after ion implantation to completely cover the aluminum concentration distribution after ion implantation. The amount of carbon vacancies in the p-well region 16 is reduced by completely covering the aluminum concentration distribution after ion implantation with the carbon concentration distribution after ion implantation.

From the viewpoint of appropriately maintaining the depth of the p-well region 16, it is preferable that the first projected range Rp1 and the second projected range Rp2 are equal to or less than 0.6 μm.

In addition, in the method of manufacturing the MOSFET 100 of the first embodiment, the gate insulating layer 28 is formed by using the vapor deposition method. Therefore, oxidation of the surface of the silicon carbide layer 10 is suppressed. As a result, the second surface structure formed on the surface of the silicon carbide layer 10 is maintained even after the gate insulating layer 28 is formed.

The temperature for forming the gate insulating layer 28 is preferably equal to or less than 600° C., more preferably equal to or less than 500° C., and even more preferably equal to or less than 400° C. By lowering the temperature at which the gate insulating layer 28 is formed, the oxidation of the surface of the silicon carbide layer 10 is suppressed.

The gate insulating layer 28 preferably has a silicon oxide film whose entire film is rich in silicon by lowering the oxygen partial pressure during growth. As $SiO_{2-\delta}$, $0.01 \leq \delta \leq 0.1$ is preferable. That is, it is preferable to make an adjustment so that the oxygen deficiency is equal to or more than 0.5% and equal to or less than 58. This is because, if there is excess oxygen in the silicon oxide film when forming the gate insulating film, there is a risk of substrate oxidation and accordingly, it is preferable to have no excess oxygen. By performing the fourth heat treatment, oxygen is supplied to the oxygen deficiency in the insulating film, so that a good silicon oxide film having no oxygen deficiency is finally obtained.

In addition, in the method of manufacturing the MOSFET 100 of the first embodiment, the interface termination region 40 is formed by the third heat treatment in an atmosphere containing ammonia gas ($NH_3$). The interface termination region 40 is formed in an atmosphere containing ammonia gas without interface oxidation. Then, only the silicon atom in the first layer, which is the uppermost layer of the second surface structure, is bonded to the oxygen atom in the gate insulating layer 28. Therefore, the surface of the silicon carbide layer 10 after the interface termination region 40 is formed can be converted into the first surface structure with good controllability.

As described above, according to the first embodiment, a semiconductor device having improved carrier mobility and a method of manufacturing the semiconductor device are realized.

Second Embodiment

An inverter circuit and a drive device of a second embodiment are an inverter circuit and a drive device including the semiconductor device of the first embodiment.

Figure 29:
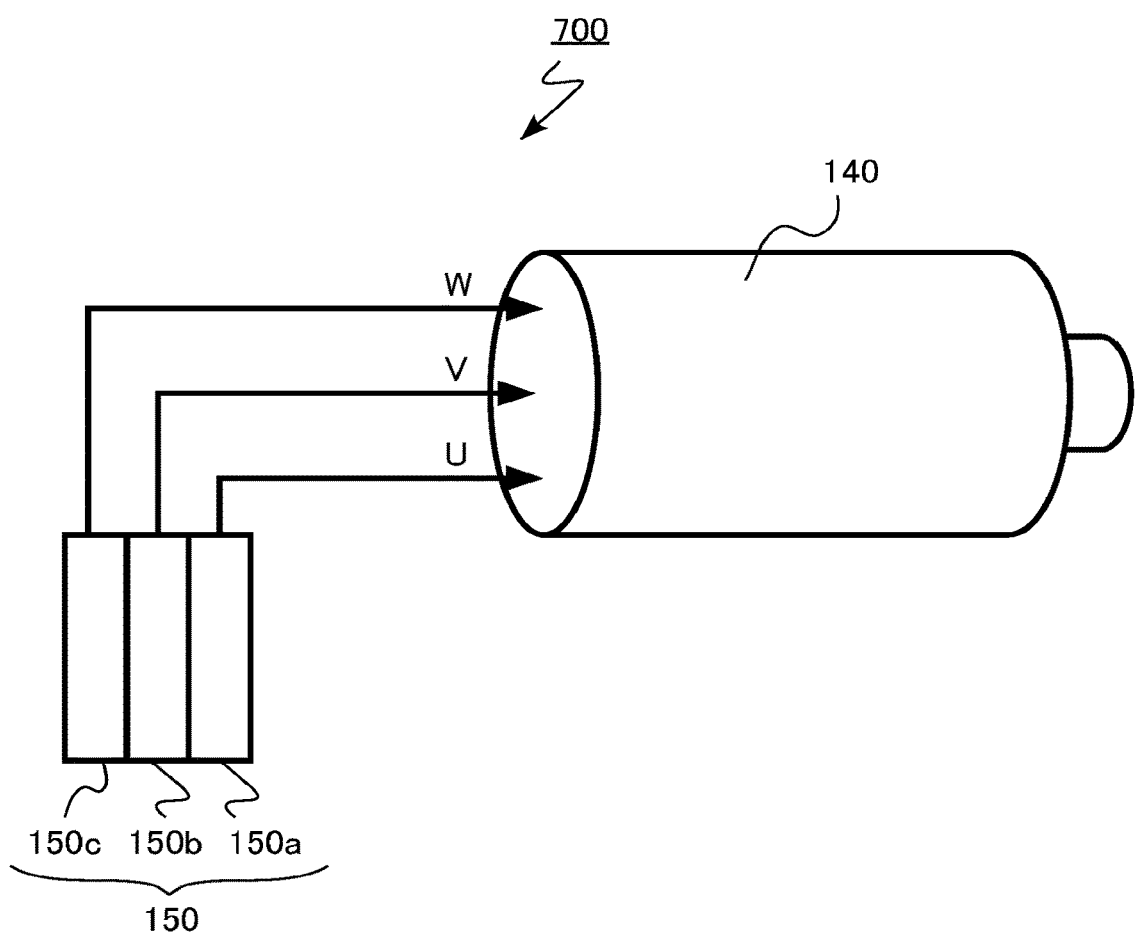
FIG. 29 is a schematic diagram of a drive device of a second embodiment.

FIG. 29 is a schematic diagram of the drive device of the second embodiment. A drive device 700 includes a motor 140 and an inverter circuit 150.

The inverter circuit 150 includes three semiconductor modules 150a, 150b, and 150c having the MOSFET 100 of the first embodiment as a switching element. By connecting the three semiconductor modules 150a, 150b, and 150c in parallel to each other, a three-phase inverter circuit 150 having three AC voltage output terminals U, V, and W is realized. The motor 140 is driven by the AC voltage output from the inverter circuit 150.

According to the second embodiment, the characteristics of the inverter circuit 150 and the drive device 700 are improved by providing the MOSFET 100 with improved characteristics.

Third Embodiment

A vehicle of a third embodiment is a vehicle including the semiconductor device of the first embodiment.

Figure 30:
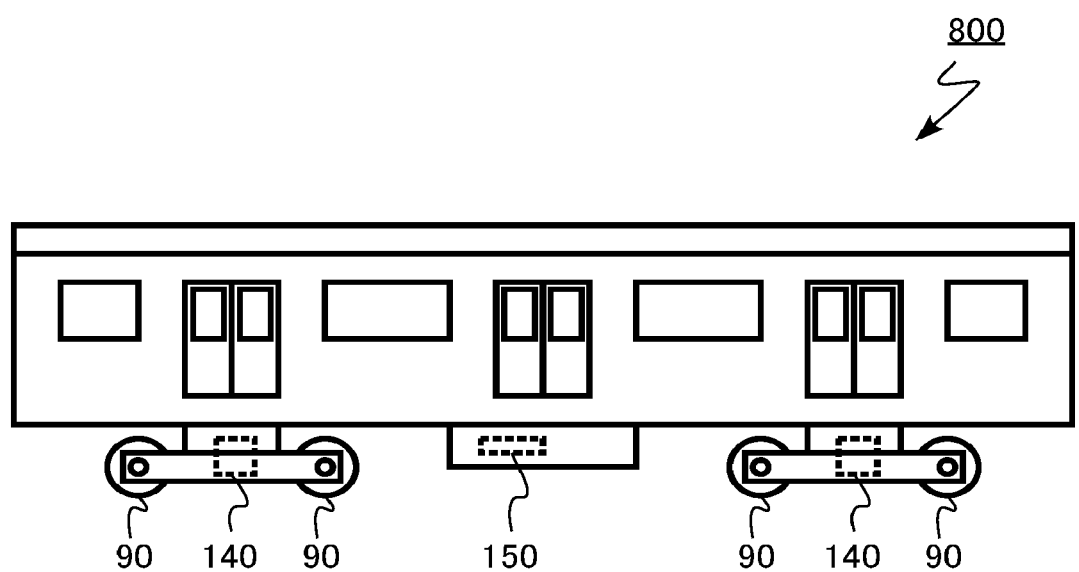
FIG. 30 is a schematic diagram of a vehicle of a third embodiment.

FIG. 30 is a schematic diagram of the vehicle of the third embodiment. A vehicle 800 of the third embodiment is a railroad vehicle. The vehicle 800 includes the motor 140 and the inverter circuit 150.

The inverter circuit 150 includes three semiconductor modules having the MOSFET 100 of the first embodiment as a switching element. By connecting the three semiconductor modules in parallel to each other, a three-phase inverter circuit 150 having three AC voltage output terminals U, V, and W is realized. The motor 140 is driven by the AC voltage output from the inverter circuit 150. The motor 140 rotates wheels 90 of the vehicle 800.

According to the third embodiment, the characteristics of the vehicle 800 are improved by providing the MOSFET 100 with improved characteristics.

Fourth Embodiment

A vehicle of a fourth embodiment is a vehicle including the semiconductor device of the first embodiment.

Figure 31:
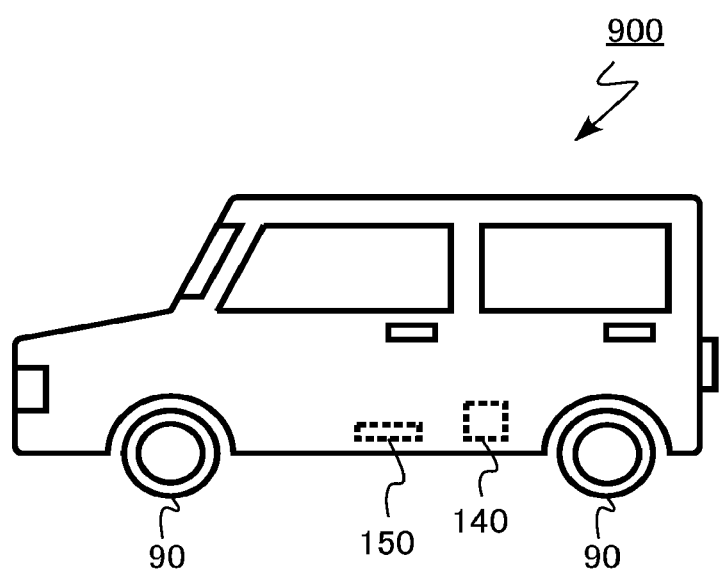
FIG. 31 is a schematic diagram of a vehicle of a fourth embodiment.

FIG. 31 is a schematic diagram of the vehicle of the fourth embodiment. A vehicle 900 of the fourth embodiment is an automobile. The vehicle 900 includes the motor 140 and the inverter circuit 150.

The inverter circuit 150 includes three semiconductor modules having the MOSFET 100 of the first embodiment as a switching element. By connecting the three semiconductor modules in parallel to each other, a three-phase inverter circuit 150 having three AC voltage output terminals U, V, and W is realized.

The motor 140 is driven by the AC voltage output from the inverter circuit 150. The motor 140 rotates wheels 90 of the vehicle 900.

According to the fourth embodiment, the characteristics of the vehicle 900 are improved by providing the MOSFET 100 with improved characteristics.

Fifth Embodiment

An elevator of a fifth embodiment is an elevator including the semiconductor device of the first embodiment.

Figure 32:
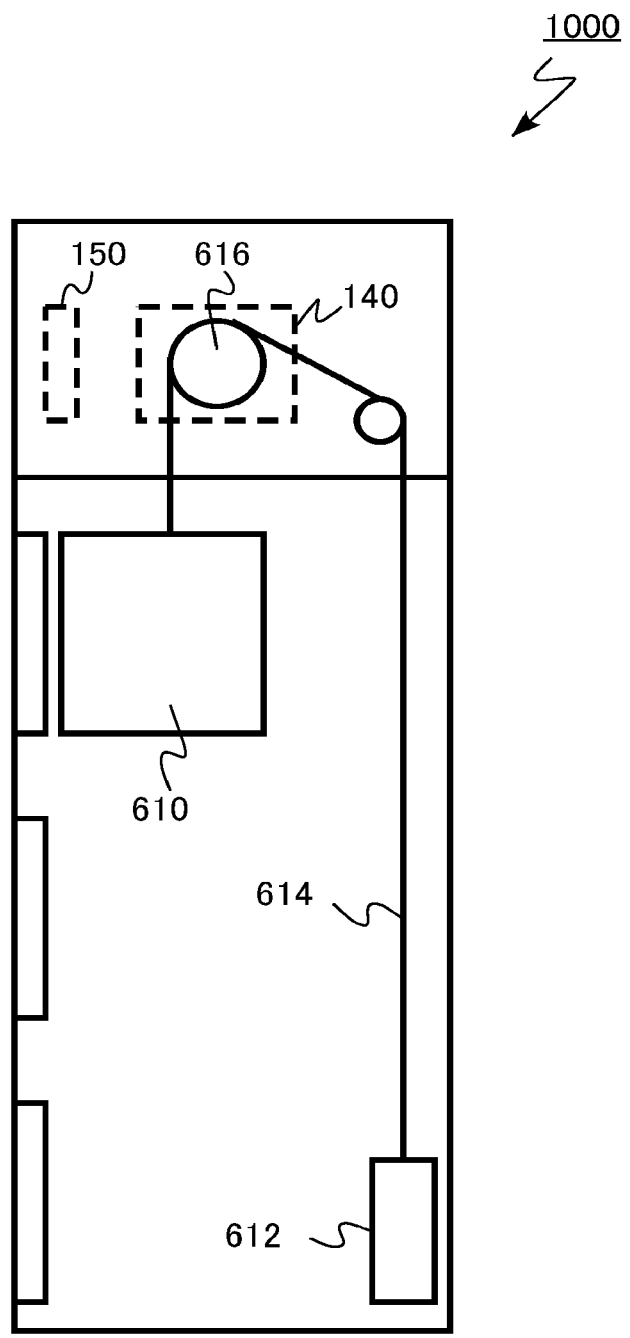
FIG. 32 is a schematic diagram of an elevator of a fifth embodiment.

FIG. 32 is a schematic diagram of the elevator of the fifth embodiment. An elevator 1000 of the fifth embodiment includes a car 610, a counterweight 612, a wire rope 614, a hoisting machine 616, the motor 140, and the inverter circuit 150.

The inverter circuit 150 includes three semiconductor modules having the MOSFET 100 of the first embodiment as a switching element. By connecting the three semiconductor modules in parallel to each other, a three-phase inverter circuit 150 having three AC voltage output terminals U, V, and W is realized.

The motor 140 is driven by the AC voltage output from the inverter circuit 150. The hoisting machine 616 is rotated by the motor 140, and the car 610 is moved up and down.

According to the fifth embodiment, the characteristics of the elevator 1000 are improved by providing the MOSFET 100 with improved characteristics.

In the first embodiment, the n-channel MOSFET has been described as an example, but embodiments can also be applied to an n-channel insulated gate bipolar transistor (IGBT).

In addition, in the third to fifth embodiments, the cases where the semiconductor devices of embodiments are applied to a vehicle or an elevator have been described as examples. However, the semiconductor devices of embodiments can also be applied to, for example, a power conditioner of a photovoltaic power generation system.

While certain embodiments have been described, these embodiments have been presented by way of example only, and are not intended to limit the scope of the inventions. Indeed, the semiconductor device, the semiconductor device manufacturing method, the inverter circuit, the drive device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device manufacturing method, comprising:
performing a first heat treatment on a silicon carbide layer with a surface having an off angle equal to or more than 0° and equal to or less than 8° with respect to a {0001} face in an atmosphere containing hydrogen at a temperature equal to or more than 900° C. and equal to or less than 1400° C.;
performing a second heat treatment in an atmosphere containing fluorine at a temperature equal to or more than 900° C. and equal to or less than 1400° C.;
forming a silicon oxide film on the silicon carbide layer;
performing a third heat treatment in an atmosphere containing nitrogen; and
forming a gate electrode on the silicon oxide film.

2. The semiconductor device manufacturing method according to claim 1, further comprising:
performing first ion implantation implanting aluminum (Al) into the silicon carbide layer in a first projected range with a first dose amount before the performing the first heat treatment; and
performing second ion implantation implanting carbon (C) into the silicon carbide layer in a second projected range with a second dose amount before the performing the first heat treatment, the second dose amount being 10 times or more the first dose amount.

3. The semiconductor device manufacturing method according to claim 2,
wherein the first ion implantation and the second ion implantation are performed in a same region of the silicon carbide layer.

4. The semiconductor device manufacturing method according to claim 2,
wherein the second projected range is equal to or more than 80% and equal to or less than 120% of the first projected range.

5. The semiconductor device manufacturing method according to claim 1,
wherein the fluorine contained in the atmosphere during the second heat treatment is atomic fluorine produced by using a heating catalyst method.

6. The semiconductor device manufacturing method according to claim 1,
wherein the atmosphere containing nitrogen is an atmosphere containing ammonia gas.

7. The semiconductor device manufacturing method according to claim 1,
wherein the silicon oxide film is formed at a temperature equal to or less than 600° C.

8. The semiconductor device manufacturing method according to claim 1,
wherein the silicon oxide film is formed by using a vapor deposition method.

9. The semiconductor device manufacturing method according to claim 1, further comprising:
performing a fourth heat treatment in an atmosphere containing nitrogen oxide gas after the performing the third heat treatment.

* * * * *